(12) United States Patent
Wu et al.

(10) Patent No.: US 10,886,259 B2
(45) Date of Patent: Jan. 5, 2021

(54) DISPLAY DEVICES

(71) Applicant: InnoLux Corporation, Miao-Li County (TW)

(72) Inventors: Yuan-Lin Wu, Miao-Li County (TW); Kuan-Feng Lee, Miao-Li County (TW); Wei-Cheng Chu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/410,114

(22) Filed: May 13, 2019

(65) Prior Publication Data

US 2019/0267359 A1 Aug. 29, 2019

Related U.S. Application Data

(63) Continuation of application No. 15/593,626, filed on May 12, 2017, now Pat. No. 10,340,256.

(Continued)

(51) Int. Cl.
*H01L 25/075* (2006.01)
*H01L 33/38* (2010.01)
(Continued)

(52) U.S. Cl.
CPC .......... *H01L 25/0753* (2013.01); *H01L 33/20* (2013.01); *H01L 33/58* (2013.01);
(Continued)

(58) Field of Classification Search
CPC ..... H01L 25/0753; H01L 33/19; H01L 33/20; H01L 33/58; H01L 33/62; H01L 2933/0033; H01L 33/38
See application file for complete search history.

(56) References Cited

U.S. PATENT DOCUMENTS 7,821,198 B2 10/2010 Kim et al.
10,319,697 B2 6/2019 Zou et al.
(Continued)

FOREIGN PATENT DOCUMENTS

CN 101097911 A 1/2008
CN 105280633 A 1/2016
(Continued)

OTHER PUBLICATIONS

Chinese language office action dated Oct. 11, 2019, issued in application No. CN 201710551955.X.

*Primary Examiner* — Latanya N Crawford Eason
(74) *Attorney, Agent, or Firm* — McClure, Qualey & Rodack, LLP

(57) ABSTRACT

A display device is provided. The display device includes a substrate having a surface including a display area and a non-display area adjacent to the display area; a plurality of light-emitting diodes disposed on the display area of the substrate, wherein the light-emitting diode includes a contact electrode; and an anisotropic conductive layer disposed between the substrate and the plurality of light-emitting diodes, wherein the anisotropic conductive layer has a cross-sectional sidewall profile, and at least a part of the cross-sectional sidewall profile of the anisotropic conductive layer is in a shape of curve.

18 Claims, 32 Drawing Sheets

Related U.S. Application Data

(60) Provisional application No. 62/465,869, filed on Mar. 2, 2017, provisional application No. 62/429,162, filed on Dec. 2, 2016, provisional application No. 62/394,225, filed on Sep. 14, 2016.

(51) Int. Cl.
  *H01L 33/20* (2010.01)
  *H01L 33/58* (2010.01)
  *H01L 33/62* (2010.01)

(52) U.S. Cl.
  CPC ...... *H01L 33/62* (2013.01); *H01L 2933/0033* (2013.01); *H01L 2933/0058* (2013.01); *H01L 2933/0066* (2013.01)

(56) References Cited

U.S. PATENT DOCUMENTS

| | | |
|---|---|---|
| 2013/0092310 A1 | 4/2013 | Ishigami et al. |
| 2015/0255505 A1 | 9/2015 | Jeoung et al. |
| 2017/0062674 A1* | 3/2017 | Kwon ................. H01L 25/0753 |
| 2017/0179092 A1 | 6/2017 | Sasaki et al. |
| 2017/0221981 A1 | 8/2017 | Tsuruoka et al. |
| 2017/0154919 A1 | 9/2017 | Chen et al. |
| 2017/0263593 A1 | 9/2017 | Zou et al. |
| 2017/0271312 A1 | 9/2017 | Kwon |
| 2018/0122786 A1 | 5/2018 | Wu et al. |

FOREIGN PATENT DOCUMENTS

| | | |
|---|---|---|
| CN | 105493297 A | 4/2016 |
| CN | 105895769 A | 8/2016 |

\* cited by examiner

DISPLAY DEVICES

CROSS REFERENCE TO RELATED APPLICATIONS

This application is a Continuation of application Ser. No. 15/593,626, filed on May 12, 2017, now U.S. Pat. No. 10,340,256, which claims the benefit of U.S. Provisional Application No. 62/394,225, filed on Sep. 14, 2016, U.S. Provisional Application No. 62/429,162, filed on Dec. 2, 2016, and U.S. Provisional Application No. 62/465,869, filed on Mar. 2, 2017, the entireties of which are incorporated by reference herein.

TECHNICAL FIELD

The technical field relates to a micro-LED display and a bonding method thereof.

BACKGROUND

In a fabrication process of a micro-LED display, some problems need to be considered, such as bonding capabilities and ESD phenomenon.

Therefore, it is desirable to develop a display device which is capable of effectively fixing LEDs and reducing the ESD phenomenon.

SUMMARY

One embodiment of the disclosure provides a display device, comprising: a substrate having a surface comprising a display area and a non-display area adjacent to the display area; a plurality of light-emitting diodes disposed on the display area of the substrate, wherein the light-emitting diode comprises a contact electrode; and an anisotropic conductive layer disposed between the substrate and the plurality of light-emitting diodes, wherein the anisotropic conductive layer has a cross-sectional sidewall profile, and at least a part of the cross-sectional sidewall profile of the anisotropic conductive layer is in a shape of curve.

One embodiment of the disclosure provides a display device, comprising: a substrate comprising a display area and a non-display area adjacent to the display area; a plurality of bonding pads having a width disposed on the substrate; a plurality of light-emitting diodes disposed on the display area of the substrate corresponding to the bonding pads, wherein the light-emitting diode comprises a contact electrode; and a plurality of bumps having a width disposed between the bonding pads and the contact electrodes of the light-emitting diodes, wherein the bump has a projection area which is greater than a projection area of the bonding pad.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

Figure 1:
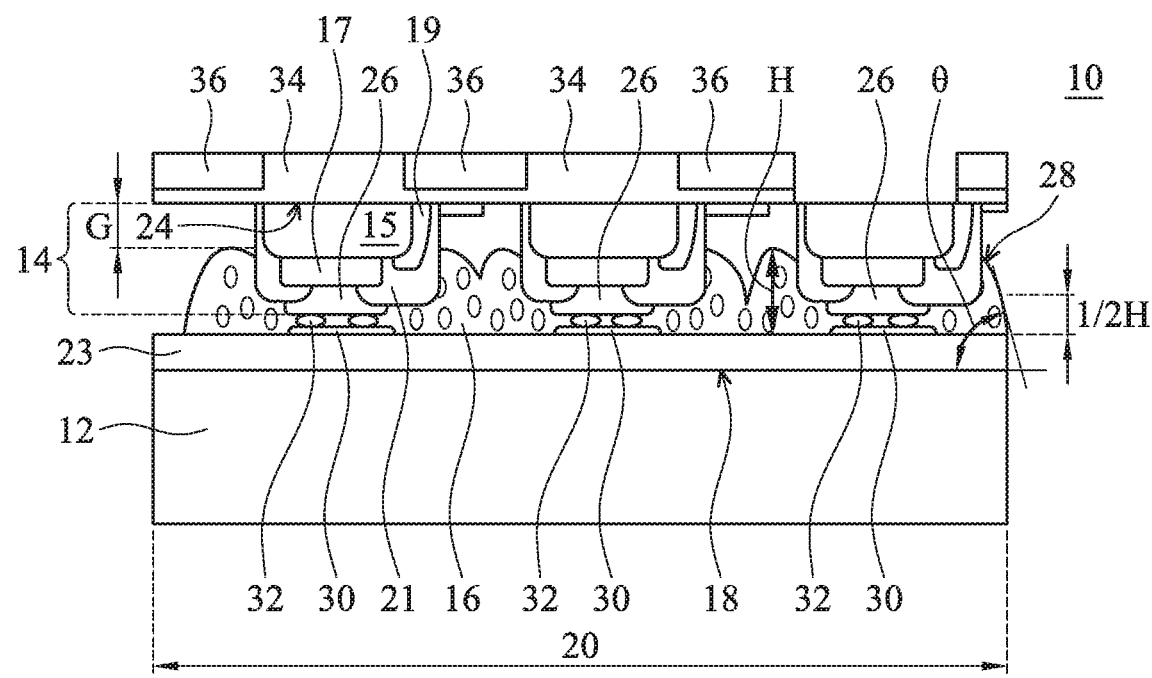
FIG. 1 is a cross-sectional view of a display device in accordance with one embodiment of the disclosure.

In the following detailed description, for the purposes of explanation, numerous specific details are set forth in order to provide a thorough understanding of the disclosed embodiments. It will be apparent, however, that one or more embodiments may be practiced without these specific details. In other instances, well-known structures and devices are shown schematically in order to simplify the drawing.

Referring to FIG. 1, in accordance with one embodiment of the disclosure, a display device 10 is provided. FIG. 1 is a cross-sectional view of the display device 10 in this embodiment.

As shown in FIG. 1, the display device 10 comprises a substrate 12, a plurality of light-emitting diodes (LED) 14 and an anisotropic conductive layer 16. The substrate 12 has a surface 18 and comprises a display area 20 and a non-display area (not shown) which is adjacent to the display area 20. The light-emitting diode (LED) 14 has a bottom 24 and is disposed on the display area 20 of the substrate 12. The light-emitting diode (LED) 14 comprises an N-type semiconductor layer 15, a P-type semiconductor layer 17, a lower electrode 19, an insulating layer 21 and a contact electrode 26. The P-type semiconductor layer 17 is formed on the N-type semiconductor layer 15. The lower electrode 19 is formed on a part of the N-type semiconductor layer 15. The insulating layer 21 is formed on the N-type semiconductor layer 15, a part of the P-type semiconductor layer 17, and the lower electrode 19. The contact electrode 26 is formed on the insulating layer 21 and in contact with the P-type semiconductor layer 17. An array layer 23 is further disposed between the anisotropic conductive layer 16 and the substrate 12. The array layer 23 includes a drive circuit to drive the LEDs 14 above. The drive circuit may be either a passive drive circuit or an active drive circuit. The anisotropic conductive layer 16 is disposed on the substrate 12 and can surround the light-emitting diodes (LED) 14. Specifically, the anisotropic conductive layer 16 has a cross-sectional sidewall profile 28, and at least a part of the cross-sectional sidewall profile 28 of the anisotropic conductive layer 16 is curved. In the disclosure, the term "on" means the definitions that one object is directly on or indirectly on another object.

In some embodiments, an angle θ between the surface 18 of the substrate 12 and the cross-sectional sidewall profile 28 of the anisotropic conductive layer 16 may be less than 90 degrees, as shown in FIG. 1. In further embodiment, the angle θ between the surface 18 of the substrate 12 and the cross-sectional sidewall profile 28 of the anisotropic conductive layer 16 may be greater than or equal to 30 degrees. The range of the cross-sectional sidewall profile 28 is from the position in contact with the insulating layer 21 to the position in contact with the array layer 23. In addition, the angle θ is defined as an angle between the surface 18 of the substrate 12 and any one tangent formed within the range from the bottom to the top position of the cross-sectional sidewall profile 28. For example, as shown in FIG. 1, the angle θ between the surface 18 of the substrate 12 and the tangent of the half-height position ½H of the cross-sectional sidewall profile 28 may be between 30 degrees and 90 degrees.

In this embodiment, the anisotropic conductive layer 16 is a continuous pattern.

In some embodiments, the display device 10 may further comprise a plurality of bonding pads 30 which are disposed on the substrate 12 and correspond to the light-emitting diodes 14.

In some embodiments, the anisotropic conductive layer 16 may comprise a plurality of conductive particles 32 located between the contact electrodes 26 of the light-emitting diodes 14 and the bonding pads 30.

In some embodiments, the display device 10 may further comprise a patterned phosphor layer 34 and a plurality of black matrices 36 disposed in the patterned phosphor layer 34, which are disposed on the light-emitting diodes 14.

In some embodiments, in accordance with optical demands of various light-emitting diodes 14, the patterned phosphor layer 34 with variable thickness corresponding to various light-emitting diodes 14 is selected.

In this embodiment, there is a gap G between the bottom 24 of the light-emitting diodes 14 and the anisotropic conductive layer 16. While the gap G exists, the use amount of the anisotropic conductive layer 16 can thus be reduced, reducing the cost.

Figure 2:
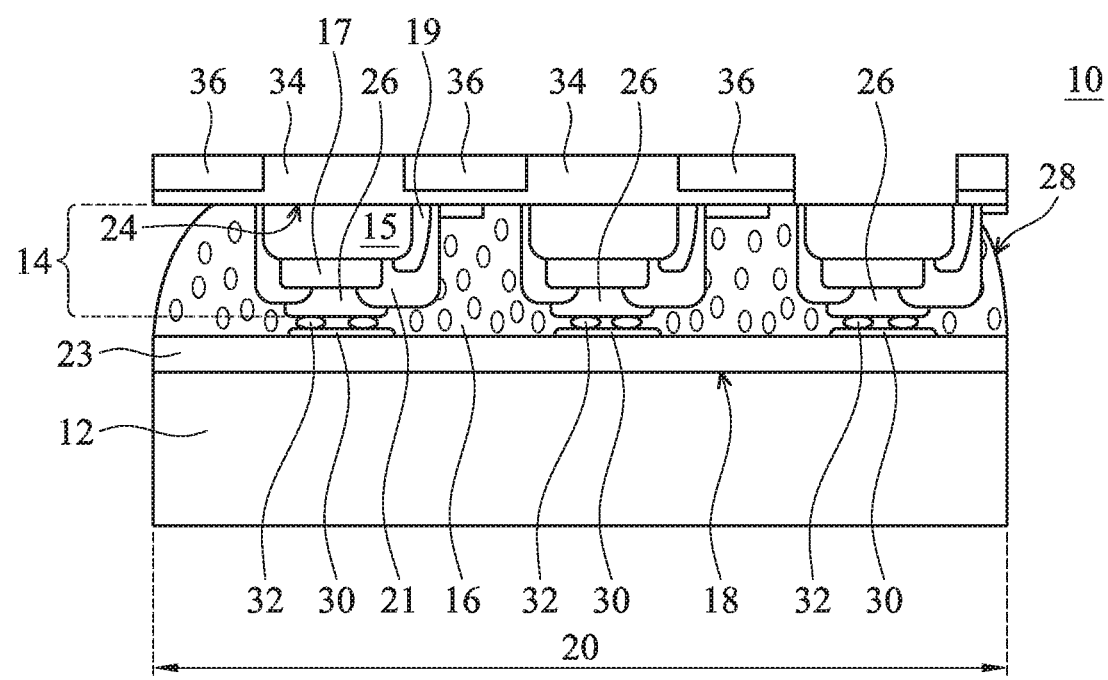
FIG. 2 is a cross-sectional view of a display device in accordance with one embodiment of the disclosure.

In some embodiments, when the use amount of the anisotropic conductive layer 16 is properly increased, the display device 10 without a gap between the bottom 24 of the light-emitting diodes 14 and the anisotropic conductive layer 16 may thus be obtained (i.e. the space between the bottom 24 of the light-emitting diodes 14 and the substrate 12 is filled with the anisotropic conductive layer 16), as shown in FIG. 2.

Referring to FIGS. 3A-3J, in accordance with one embodiment of the disclosure, a method for fabricating the display device 10 is provided. FIGS. 3A-3J are cross-sectional views of the method for fabricating the display device 10 in this embodiment.

Figure 3A:
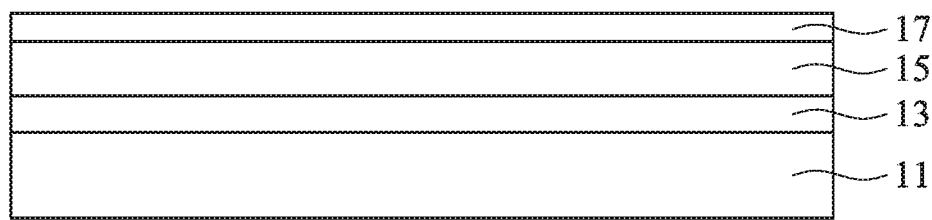
FIGS. 3A-3J are cross-sectional views of a method for fabricating a display device in accordance with one embodiment of the disclosure.

As shown in FIG. 3A, a wafer substrate 11 with an un-doped gallium nitride layer 13, an N-type semiconductor layer 15 and a P-type semiconductor layer 17 formed thereon in order is provided. The un-doped gallium nitride layer 13 is formed on the wafer substrate 11. The N-type semiconductor layer 15 is formed on the un-doped gallium nitride layer 13. The P-type semiconductor layer 17 is formed on the N-type semiconductor layer 15. In some embodiments, multiple quantum wells (not shown) are further formed between the N-type semiconductor layer 15 and the P-type semiconductor layer 17.

Figure 3B:
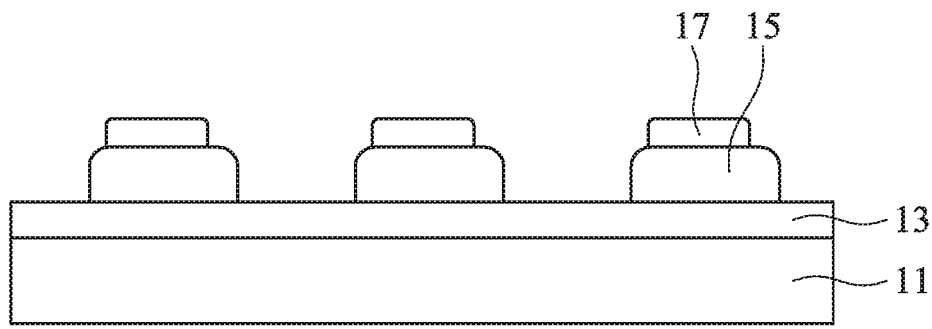

As shown in FIG. 3B, the P-type semiconductor layer 17 and the N-type semiconductor layer 15 are then etched to form a stack of the patterned N-type semiconductor layer 15 and the patterned P-type semiconductor layer 17.

Figure 3C:
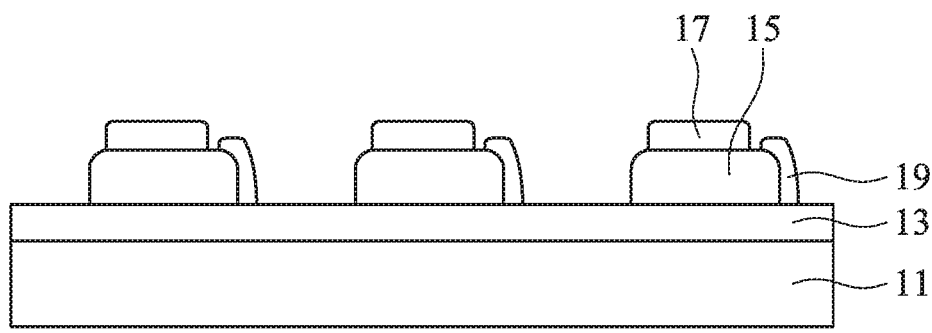

As shown in FIG. 3C, a lower electrode 19 is then formed on a part of the patterned N-type semiconductor layer 15.

Figure 3D:
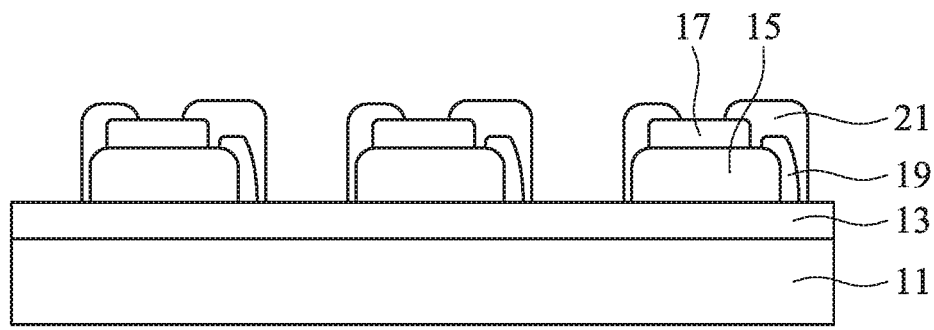

As shown in FIG. 3D, an insulating layer 21 is then formed on the patterned N-type semiconductor layer 15, a part of the patterned P-type semiconductor layer 17, and the lower electrode 19.

Figure 3E:
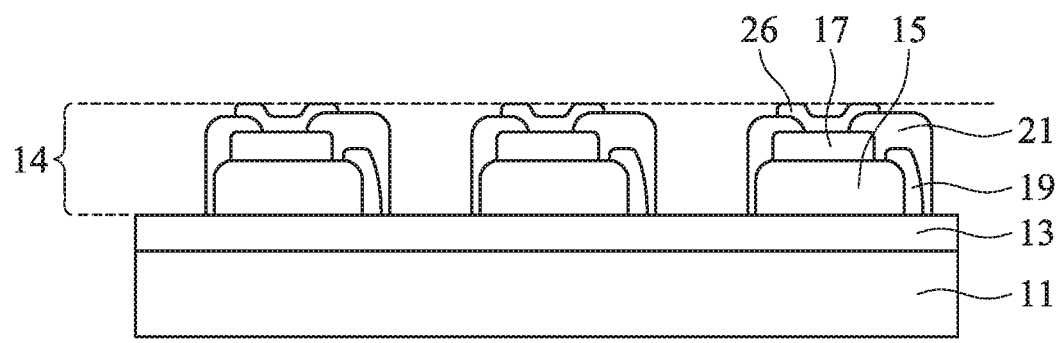

As shown in FIG. 3E, an upper electrode (a contact electrode) 26 is then formed on the insulating layer 21 and in contact with the patterned P-type semiconductor layer 17. Therefore, the wafer substrate 11 with a plurality of light-emitting diodes 14 formed thereon is fabricated.

Figure 3F:
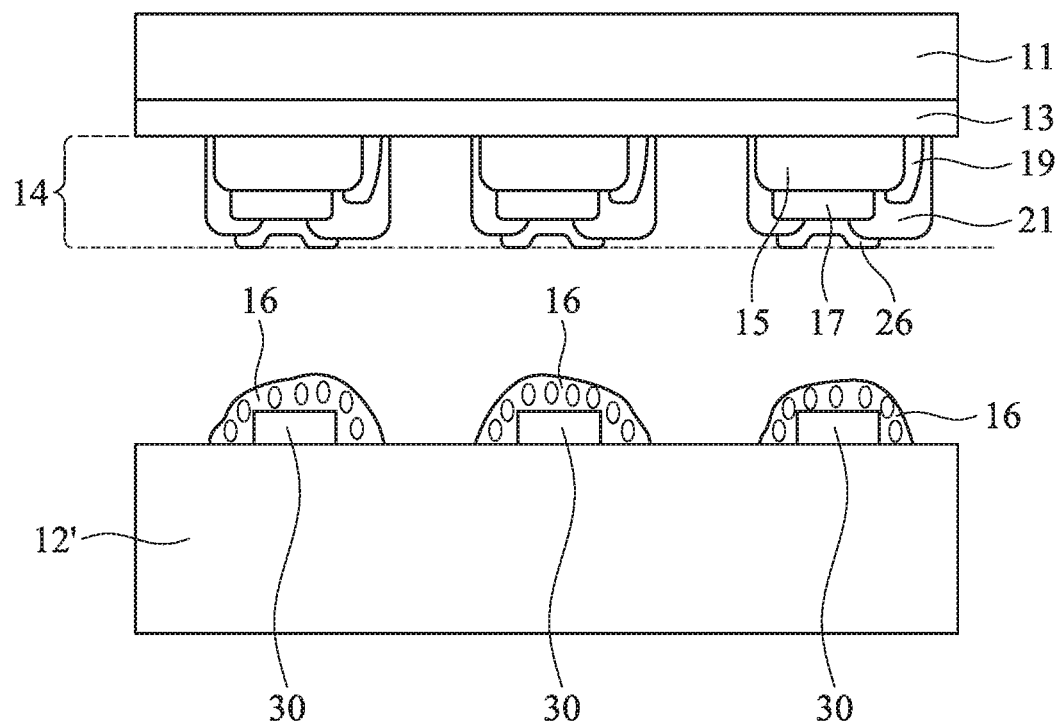

As shown in FIG. 3F, the wafer substrate 11 is then inverted. A TFT substrate 12' with a plurality of bonding pads 30 and an anisotropic conductive layer 16 formed thereon is provided. The TFT substrate 12' includes a substrate and an array layer formed thereon. The bonding pads 30 are formed on the TFT substrate 12'. The anisotropic conductive layer 16 overlies the bonding pads 30 and a part of the TFT substrate 12'.

Figure 3G:
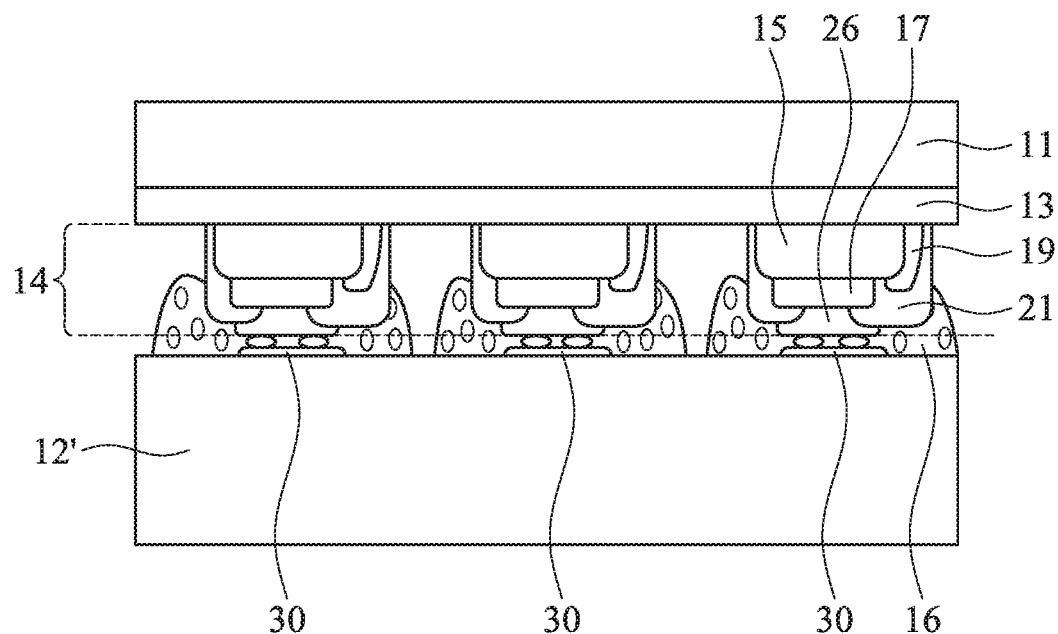

As shown in FIG. 3G, the wafer substrate 11 is then bonded to the TFT substrate 12'.

Figure 3H:
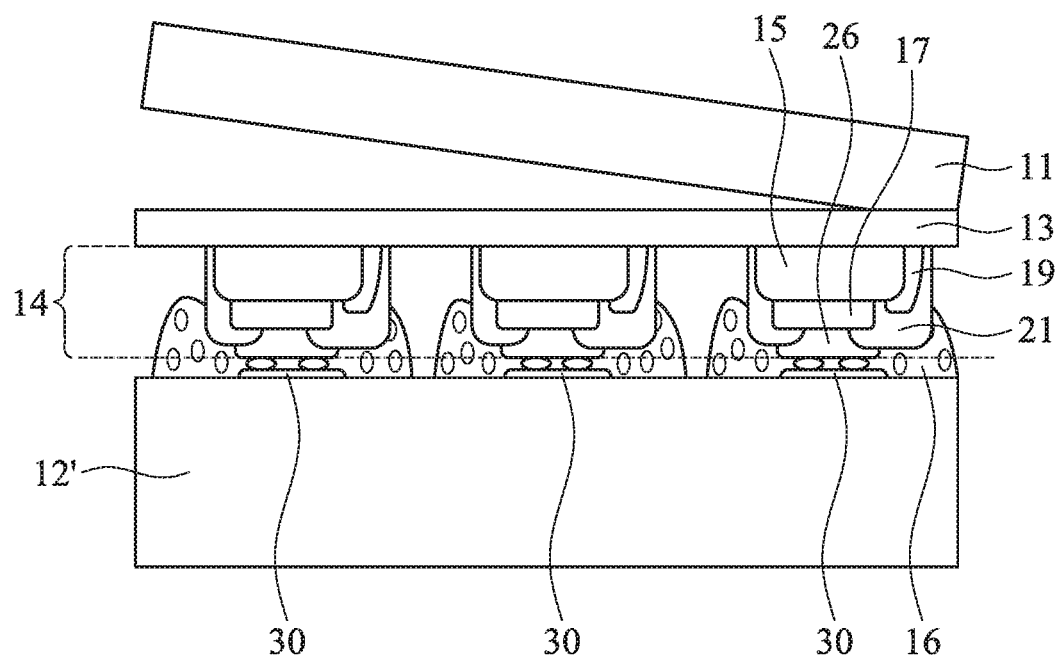

As shown in FIG. 3H, the wafer substrate 11 is then removed.

Figure 3I:
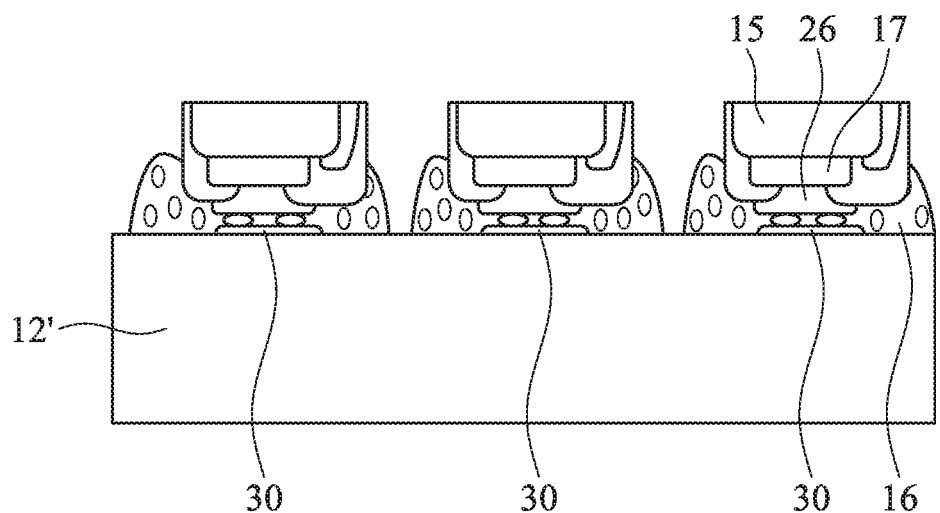
Figure 3:
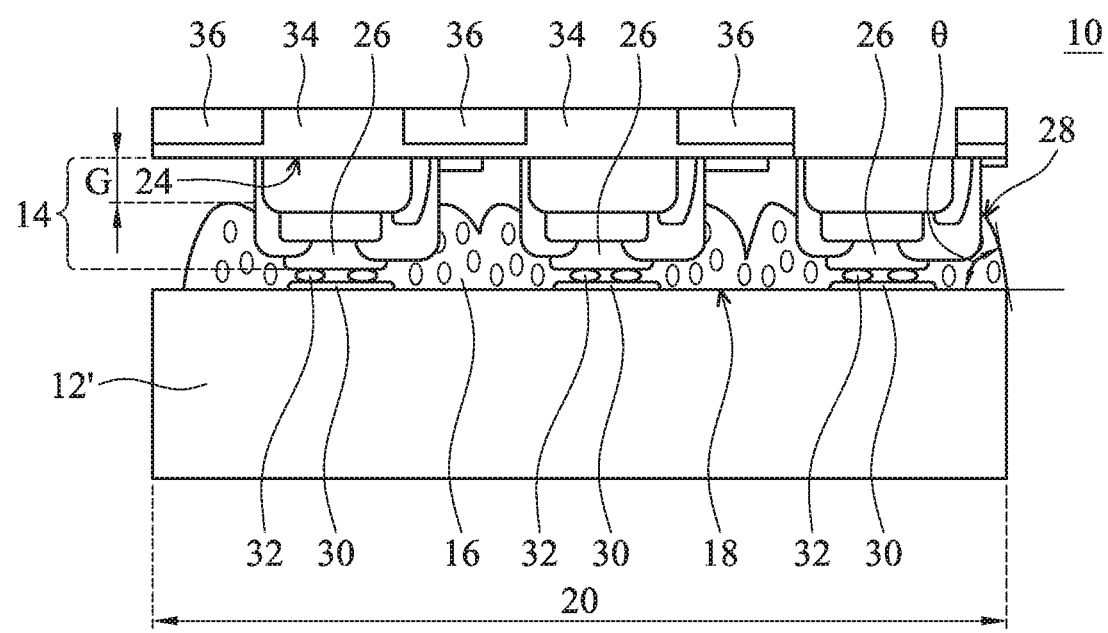

As shown in FIG. 3I, the un-doped gallium nitride layer 13 is then removed.

As shown in FIG. 3J, after a patterned phosphor layer 34 with a plurality of black matrices 36 located therein is formed on the light-emitting diodes 14, the fabrication of the display device 10 is completed.

Figure 4:
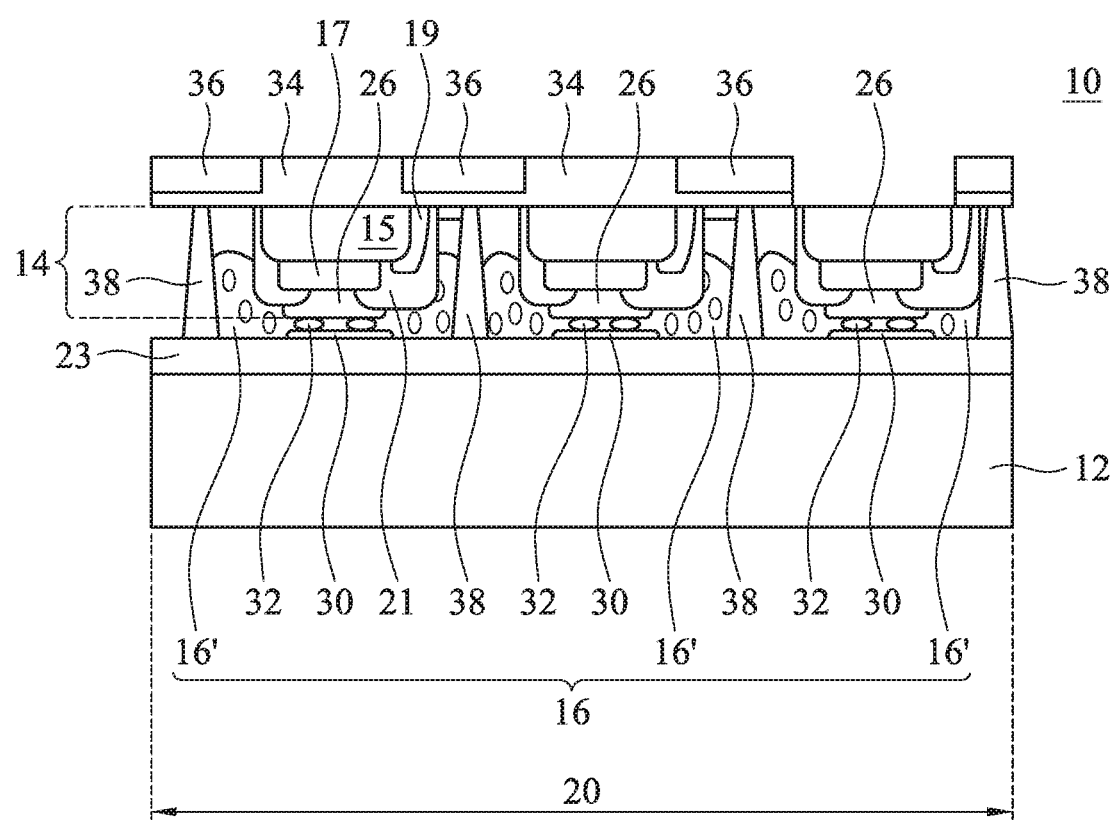
FIG. 4 is a cross-sectional view of a display device in accordance with one embodiment of the disclosure.

Referring to FIG. 4, in accordance with one embodiment of the disclosure, a display device 10 is provided. FIG. 4 is a cross-sectional view of the display device 10 in this embodiment.

As shown in FIG. 4, the display device 10 comprises a substrate 12, a plurality of light-emitting diodes (LED) 14 and an anisotropic conductive layer 16. The substrate 12 comprises a display area 20 and a non-display area (not shown) which is adjacent to the display area 20. The light-emitting diode (LED) 14 is disposed on the display area 20 of the substrate 12. The light-emitting diode (LED) 14 comprises an N-type semiconductor layer 15, a P-type semiconductor layer 17, a lower electrode 19, an insulating layer 21 and a contact electrode 26. The P-type semiconductor layer 17 is formed on the N-type semiconductor layer 15. The lower electrode 19 is formed on a part of the N-type semiconductor layer 15. The insulating layer 21 is formed on the N-type semiconductor layer 15, a part of the P-type semiconductor layer 17, and the lower electrode 19. The contact electrode 26 is formed on the insulating layer 21 and in contact with the P-type semiconductor layer 17. An array layer 23 is further disposed between the anisotropic conductive layer 16 and the substrate 12. The anisotropic conductive layer 16 is disposed on the substrate 12 and surrounds the light-emitting diodes (LED) 14.

In this embodiment, the anisotropic conductive layer 16 comprises a plurality of separated patterns 16'. Each of the separated patterns 16' can surround one light-emitting diode 14. A plurality of black matrices 38 are disposed on the substrate 12 between the separated patterns 16' of the anisotropic conductive layer 16 to avoid the mixing of light from adjacent light-emitting diodes 14.

In some embodiments, the display device 10 may further comprise a plurality of bonding pads 30 which are disposed on the substrate 12 and correspond to the light-emitting diodes 14.

In some embodiments, the anisotropic conductive layer 16 may comprise a plurality of conductive particles 32 located between the contact electrodes 26 of the light-emitting diodes 14 and the bonding pads 30.

In some embodiments, the display device 10 may further comprise a patterned phosphor layer 34 and a plurality of black matrices 36 disposed in the patterned phosphor layer 34, which are disposed on the light-emitting diodes 14.

Referring to FIGS. 5A-5D, in accordance with one embodiment of the disclosure, a method for fabricating the display device 10 is provided. FIGS. 5A-5D are cross-sectional views of the method for fabricating the display device 10 in this embodiment.

The fabrication of the wafer substrate 11 with a plurality of light-emitting diodes 14 formed thereon is referred to FIGS. 3A-3E.

Figure 5A:
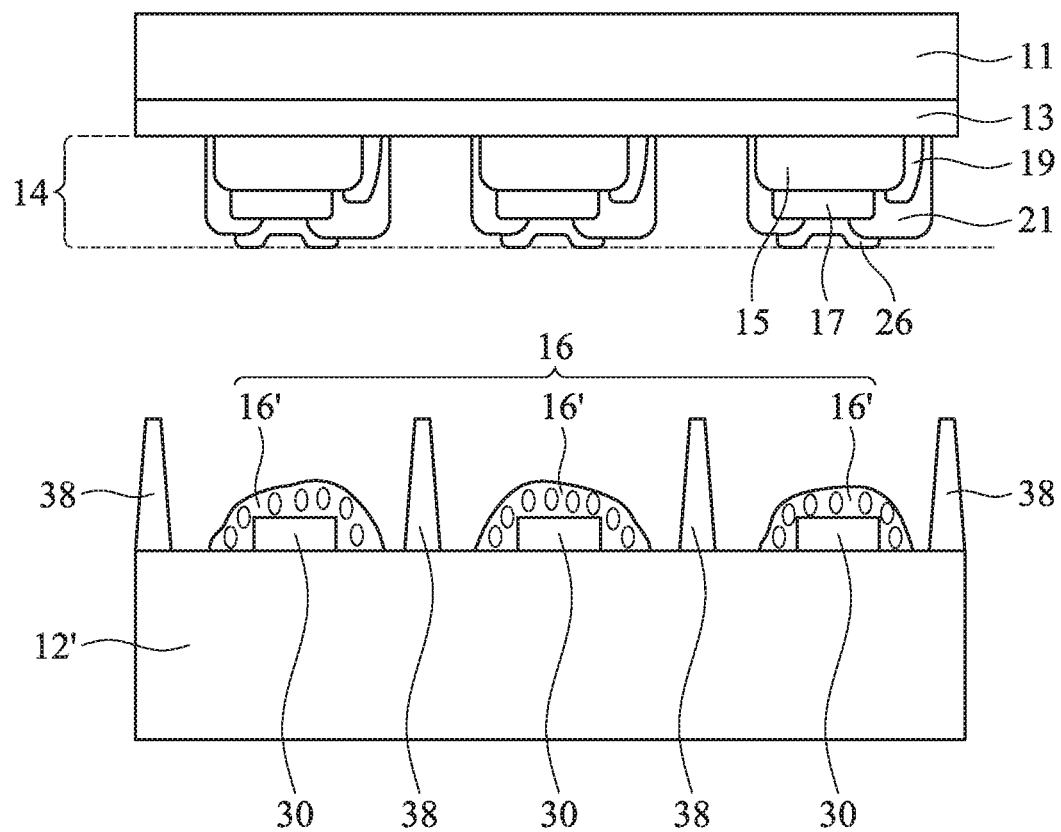
FIGS. 5A-5D are cross-sectional views of a method for fabricating a display device in accordance with one embodiment of the disclosure.

As shown in FIG. 5A, the wafer substrate 11 is then inverted. A TFT substrate 12' with a plurality of bonding pads 30, an anisotropic conductive layer 16 (divided into a plurality of separated patterns 16') and a plurality of black matrices 38 formed thereon is provided. The bonding pads 30 are formed on the TFT substrate 12'. The anisotropic conductive layer 16 overlies the bonding pads 30 and a part of the TFT substrate 12'. The black matrices 38 are formed on the TFT substrate 12' between the separated patterns 16' of the anisotropic conductive layer 16.

Figure 5B:
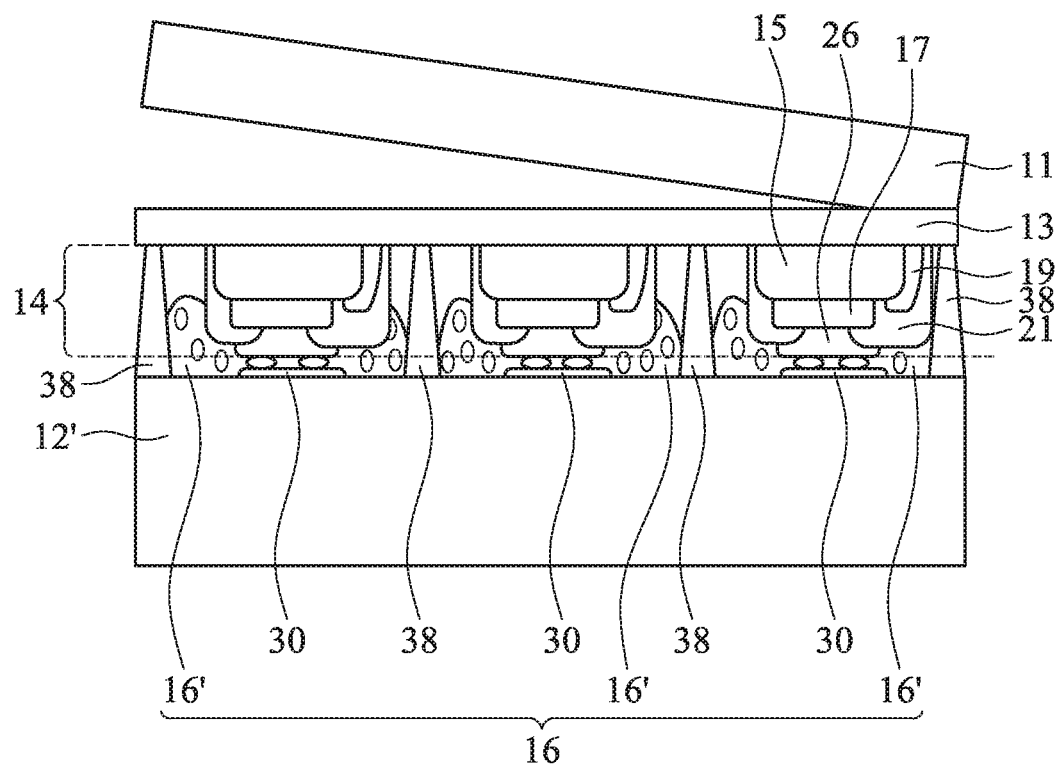

As shown in FIG. 5B, the wafer substrate 11 is then bonded to the TFT substrate 12'. The wafer substrate 11 is then removed.

Figure 5C:
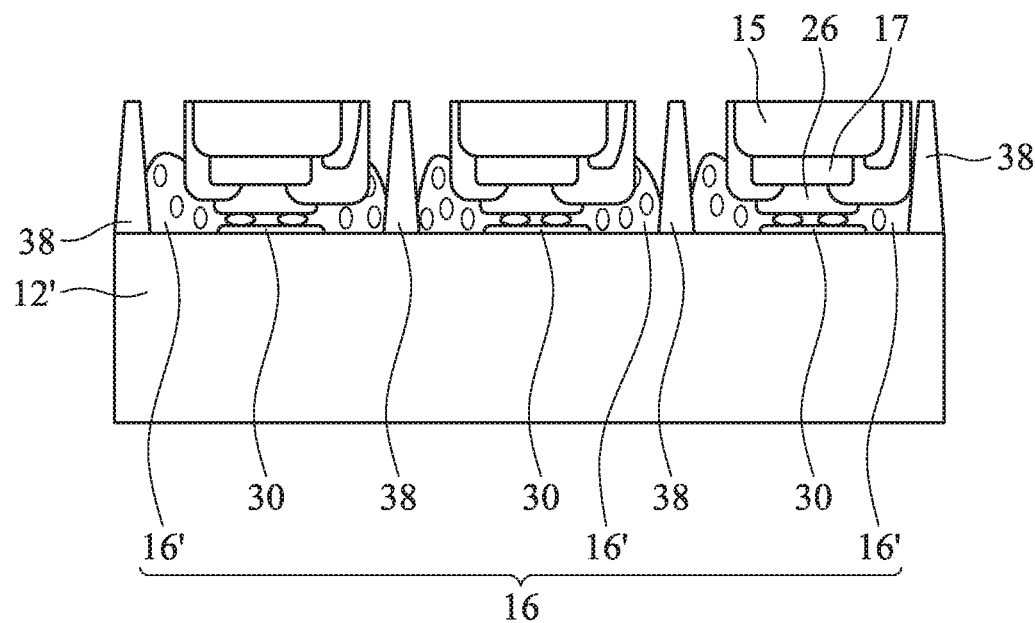

As shown in FIG. 5C, the un-doped gallium nitride layer 13 is then removed.

Figure 5D:
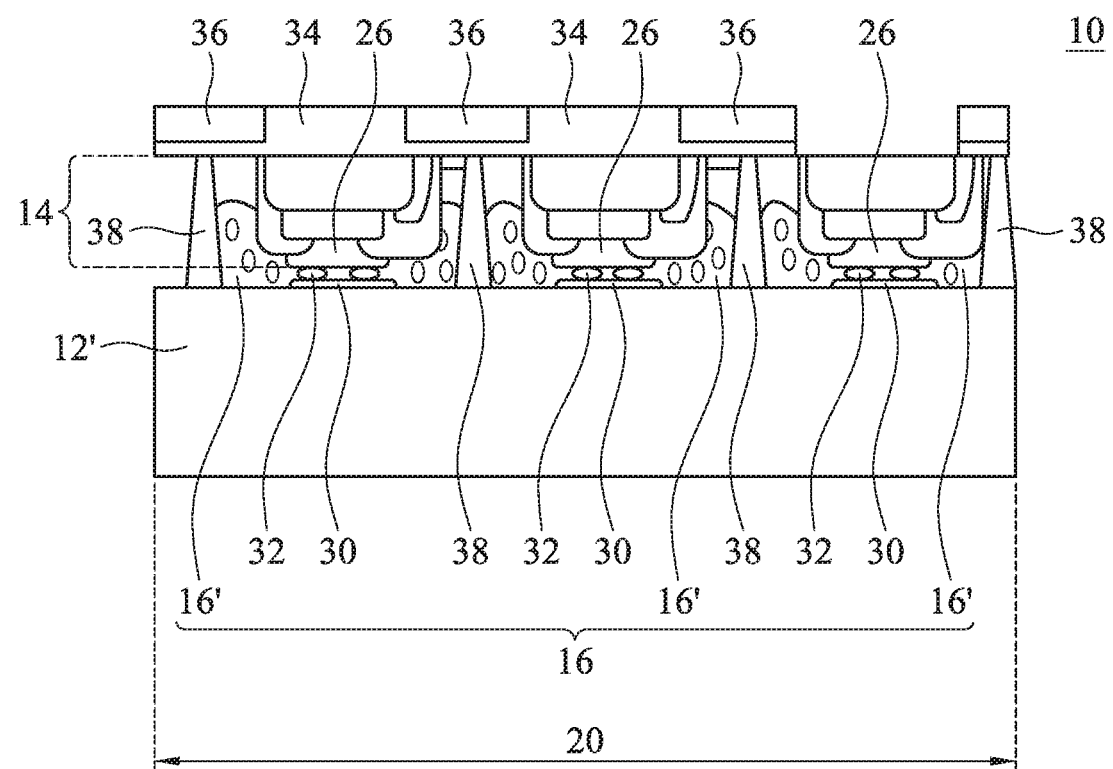

As shown in FIG. 5D, after a patterned phosphor layer 34 with a plurality of black matrices 36 located therein is formed on the light-emitting diodes 14, the fabrication of the display device 10 is completed.

Figure 6:
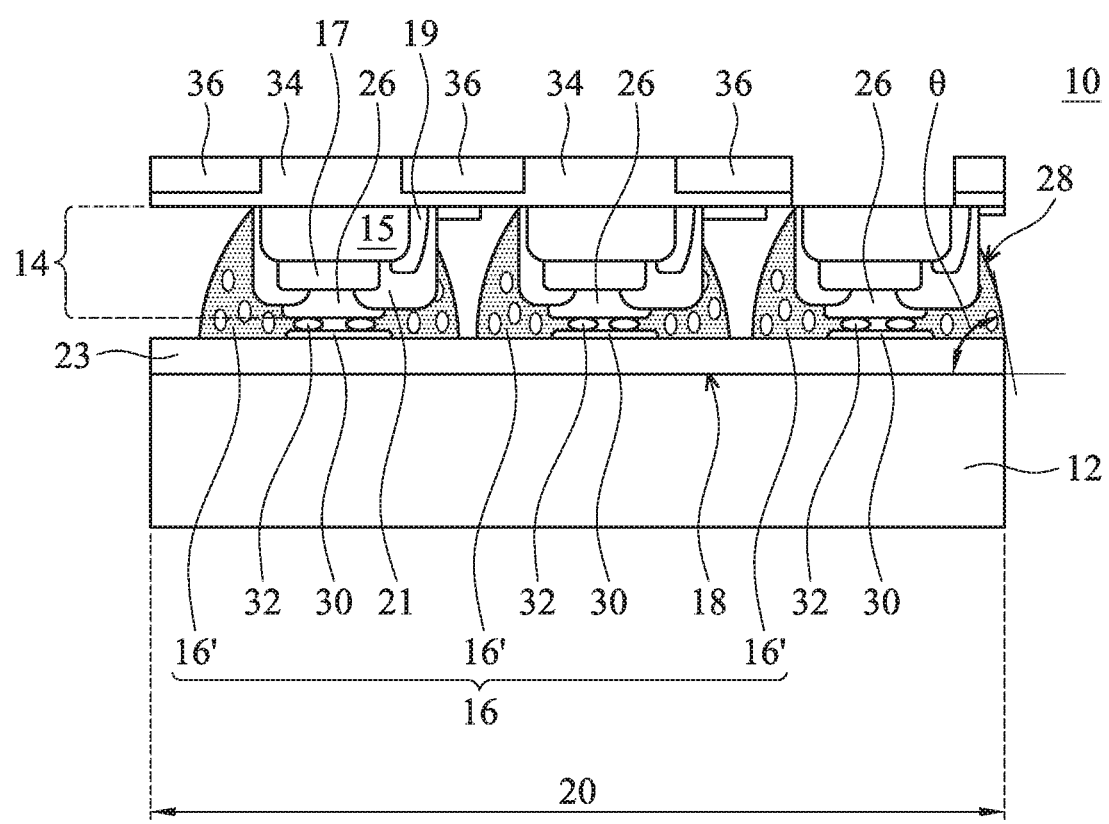
FIG. 6 is a cross-sectional view of a display device in accordance with one embodiment of the disclosure.

Referring to FIG. 6, in accordance with one embodiment of the disclosure, a display device 10 is provided. FIG. 6 is a cross-sectional view of the display device 10 in this embodiment.

As shown in FIG. 6, the display device 10 comprises a substrate 12, a plurality of light-emitting diodes (LED) 14 and an anisotropic conductive layer 16. The substrate 12 has a surface 18 and comprises a display area 20 and a non-display area (not shown) which is adjacent to the display area 20. The light-emitting diode (LED) 14 is disposed on the display area 20 of the substrate 12. The light-emitting diode (LED) 14 comprises an N-type semiconductor layer 15, a P-type semiconductor layer 17, a lower electrode 19, an insulating layer 21 and a contact electrode 26. The P-type semiconductor layer 17 is formed on the N-type semiconductor layer 15. The lower electrode 19 is formed on a part of the N-type semiconductor layer 15. The insulating layer 21 is formed on the N-type semiconductor layer 15, a part of the P-type semiconductor layer 17, and the lower electrode 19. The contact electrode 26 is formed on the insulating layer 21 and in contact with the P-type semiconductor layer 17. An array layer 23 is further disposed between the anisotropic conductive layer 16 and the substrate 12. Additionally, the anisotropic conductive layer 16 is disposed on the substrate 12 and can surround the light-emitting diodes (LED) 14. Specifically, the anisotropic conductive layer 16 has a cross-sectional sidewall profile 28, and at least a part of the cross-sectional sidewall profile 28 of the anisotropic conductive layer 16 is curved.

In some embodiments, an angle $\theta$ between the surface 18 of the substrate 12 and the cross-sectional sidewall profile 28 of the anisotropic conductive layer 16 may be less than 90 degrees, as shown in FIG. 6. In further embodiment, the angle $\theta$ between the surface 18 of the substrate 12 and the cross-sectional sidewall profile 28 of the anisotropic conductive layer 16 may be greater than or equal to 30 degrees.

In this embodiment, the anisotropic conductive layer 16 comprises a plurality of separated patterns 16'. Each of the separated patterns 16' can surround one light-emitting diode 14. Specifically, the anisotropic conductive layer 16 (with the separated patterns 16') is black. The black anisotropic conductive layer 16 is able to avoid the mixing of light from adjacent light-emitting diodes 14.

In some embodiments, the display device 10 may further comprise a plurality of bonding pads 30 which are disposed on the substrate 12 and correspond to the light-emitting diodes 14.

In some embodiments, the anisotropic conductive layer 16 may comprise a plurality of conductive particles 32 located between the contact electrodes 26 of the light-emitting diodes 14 and the bonding pads 30.

In some embodiments, the display device 10 may further comprise a patterned phosphor layer 34 and a plurality of black matrices 36 disposed in the patterned phosphor layer 34, which are disposed on the light-emitting diodes 14.

Referring to FIGS. 7A-7D in accordance with one embodiment of the disclosure, a method for fabricating the display device 10 is provided. FIGS. 7A-7D are cross-sectional views of the method for fabricating the display device 10 in this embodiment.

The fabrication of the wafer substrate 11 with a plurality of light-emitting diodes 14 formed thereon is referred to FIGS. 3A-3E.

Figure 7A:
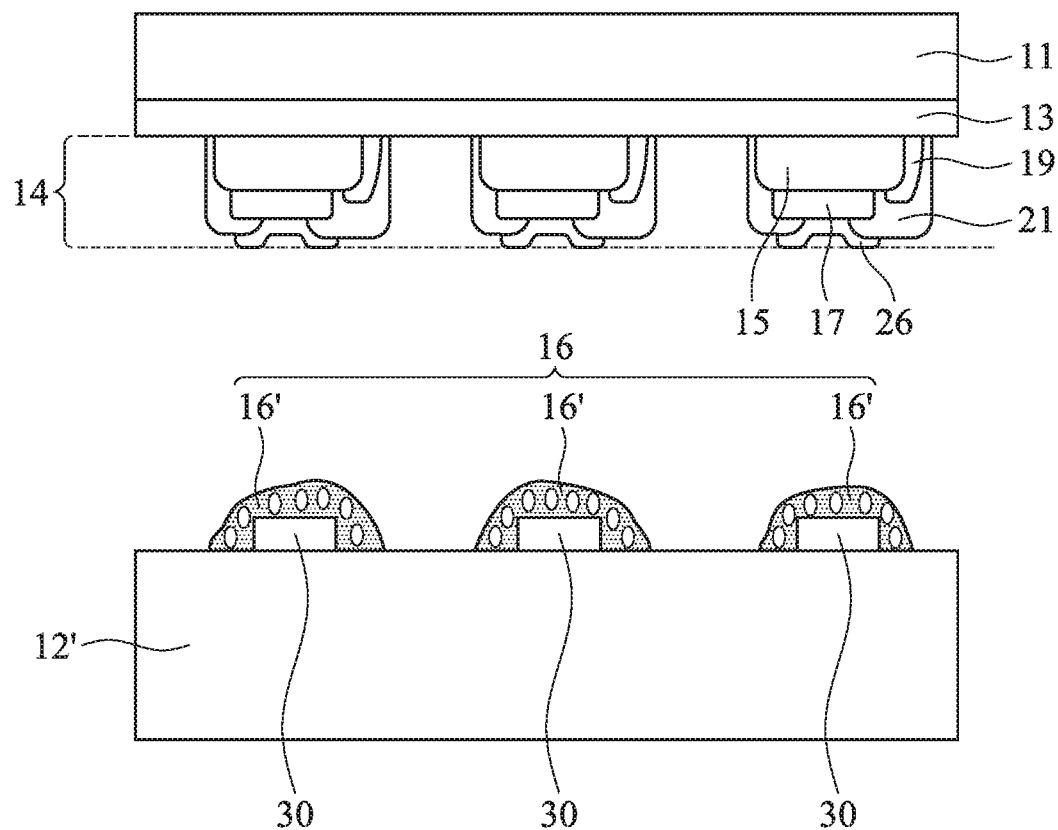
FIGS. 7A-7D are cross-sectional views of a method for fabricating a display device in accordance with one embodiment of the disclosure.

As shown in FIG. 7A, the wafer substrate 11 is then inverted. A TFT substrate 12' with a plurality of bonding pads 30 and an anisotropic conductive layer 16 (divided into a plurality of separated patterns 16') formed thereon is provided. The bonding pads 30 are formed on the TFT substrate 12'. The anisotropic conductive layer 16 overlies the bonding pads 30 and a part of the TFT substrate 12'.

Figure 7B:
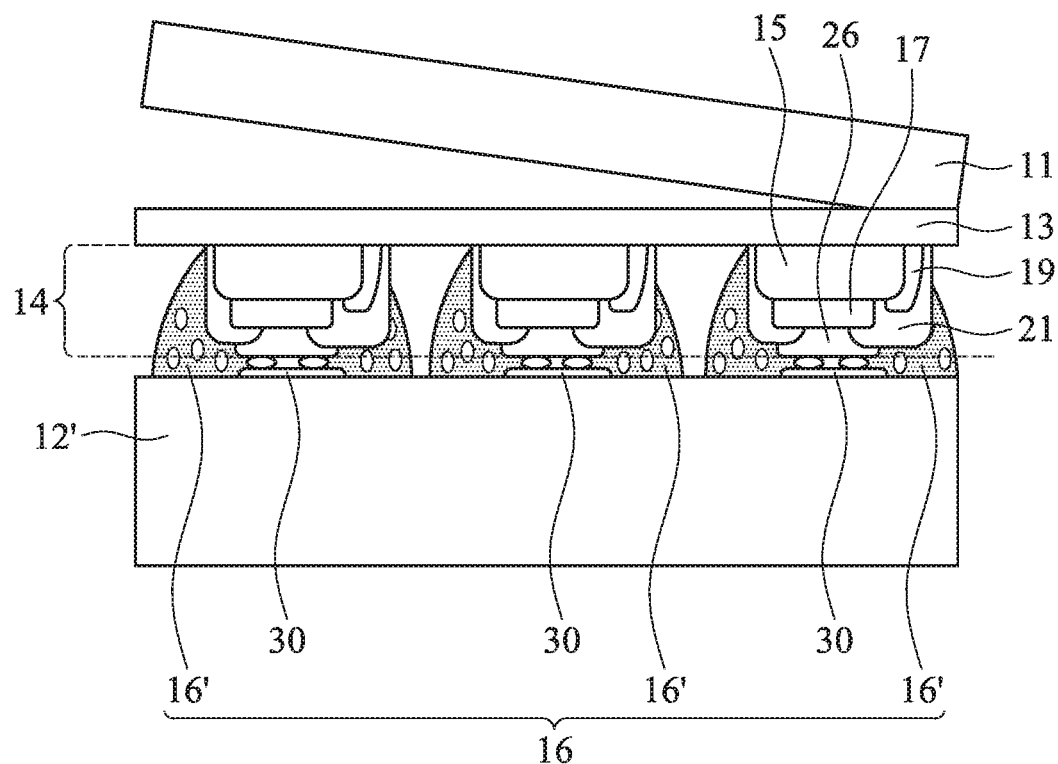

As shown in FIG. 7B, the wafer substrate 11 is then bonded to the TFT substrate 12'. The wafer substrate 11 is then removed.

Figure 7C:
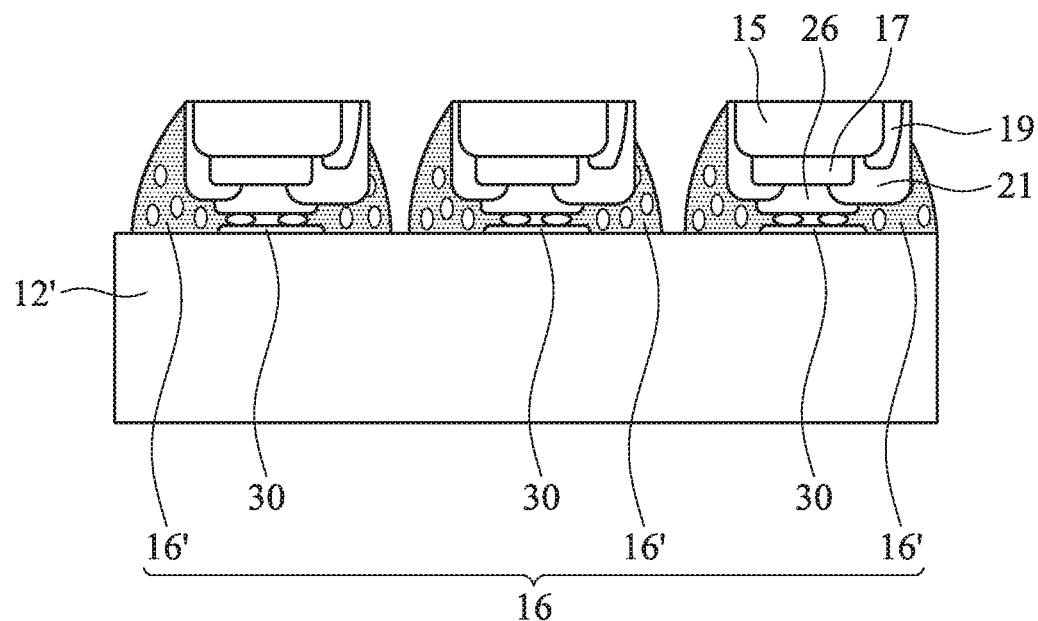

As shown in FIG. 7C, the un-doped gallium nitride layer 13 is then removed.

Figure 7D:
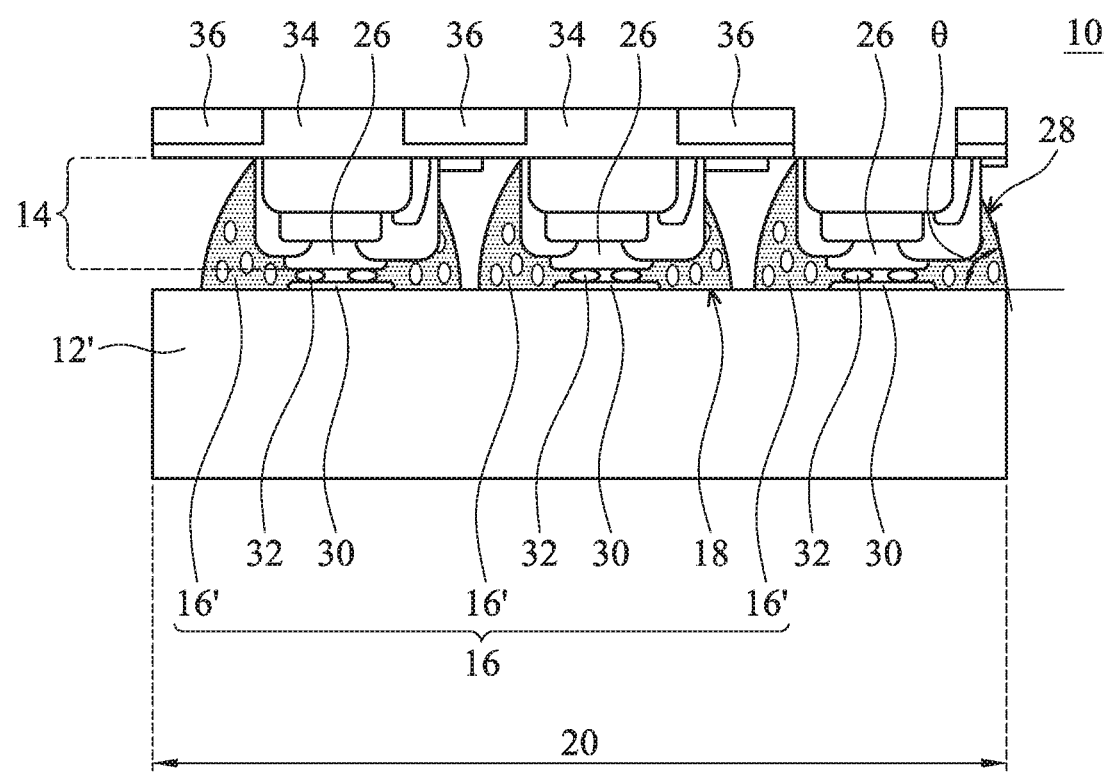

As shown in FIG. 7D, after a patterned phosphor layer 34 with a plurality of black matrices 36 located therein is formed on the light-emitting diodes 14, the fabrication of the display device 10 is completed.

Figure 8A:
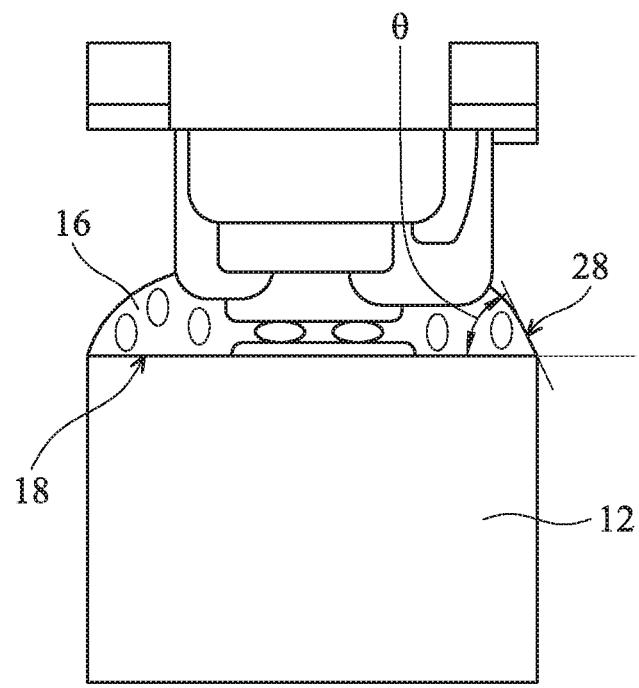
FIG. 8A is a cross-sectional view of a part of a display device in accordance with one embodiment of the disclosure.
Figure 8B:
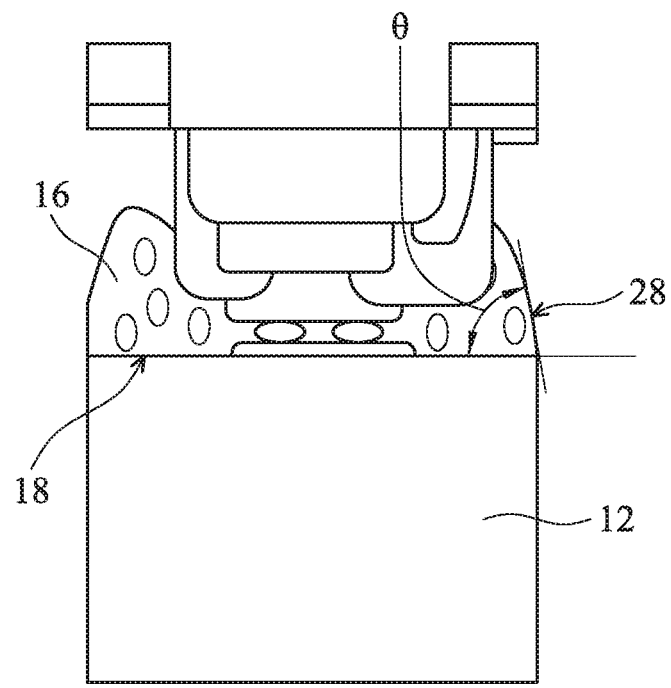
FIG. 8B is a cross-sectional view of a part of a display device in accordance with one embodiment of the disclosure.

In some embodiments, suitable cross-sectional sidewall profiles 28 of the anisotropic conductive layer 16 are provided, as shown in FIGS. 8A and 8B. FIGS. 8A and 8B are cross-sectional views of a part of the display device 10 in this embodiment. In FIG. 8A, an angle θ between the surface 18 of the substrate 12 and the cross-sectional sidewall profile 28 of the anisotropic conductive layer 16 is about 30 degrees. In FIG. 8B, the angle θ between the surface 18 of the substrate 12 and the cross-sectional sidewall profile 28 of the anisotropic conductive layer 16 is about to 90 degrees. The results indicate that the bonding process between the wafer substrate 11 and the substrate 12 are successfully performed when the angle θ between the surface 18 of the substrate 12 and the cross-sectional sidewall profile 28 of the anisotropic conductive layer 16 is within the range which is greater than or equal to 30 degrees and less than 90 degrees.

Figure 9:
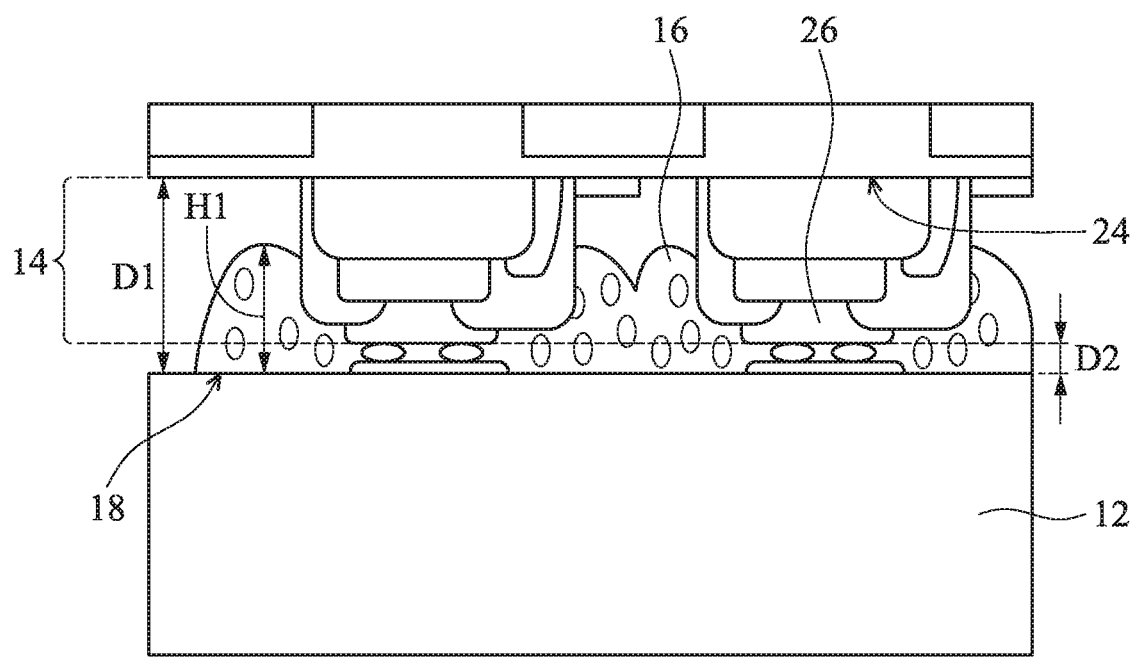
FIG. 9 is a cross-sectional view of a part of a display device in accordance with one embodiment of the disclosure.

In some embodiments, suitable size relationships among a distance D1 between the surface 18 of the substrate 12 and the bottom 24 of the light-emitting diode 14, the maximum height H1 of the continuous pattern of the anisotropic conductive layer 16, and a distance D2 between the surface 18 of the substrate 12 and the contact electrode 26 of the light-emitting diode 14 are provided, as shown in FIG. 9. FIG. 9 is a cross-sectional view of a part of the display device 10 in this embodiment. In FIG. 9, the distance D1 between the surface 18 of the substrate 12 and the bottom 24 of the light-emitting diode 14 is greater than the maximum height H1 of the continuous pattern of the anisotropic conductive layer 16, and the maximum height H1 of the continuous pattern of the anisotropic conductive layer 16 is greater than the distance D2 between the surface 18 of the substrate 12 and the contact electrode 26 of the light-emitting diode 14 to ensure that the light-emitting diodes (LED) 14 are firmly fixed using a small amount of the anisotropic conductive layer 16.

Figure 10:
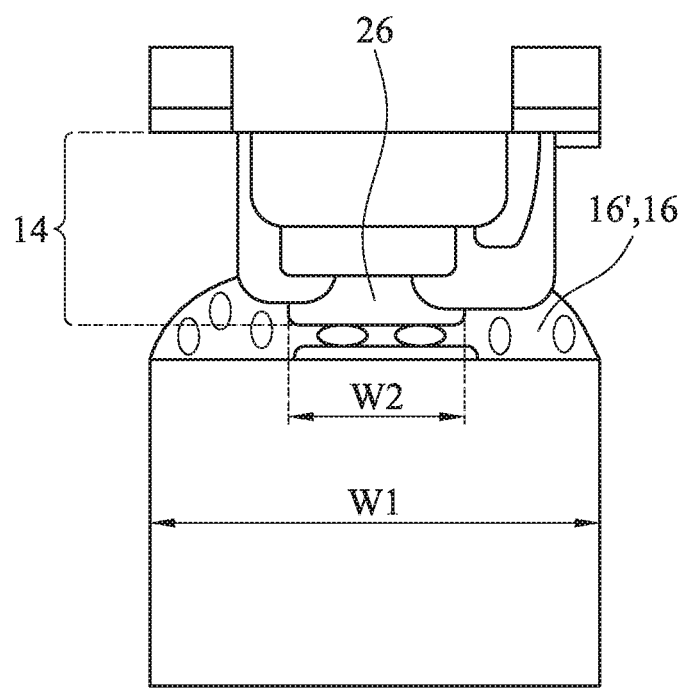
FIG. 10 is a cross-sectional view of a part of a display device in accordance with one embodiment of the disclosure.

In some embodiments, suitable size relationships between the maximum width W1 of the separated pattern 16' of the anisotropic conductive layer 16 and the maximum width W2 of the contact electrode 26 of the light-emitting diode 14 is provided, as shown in FIG. 10. FIG. 10 is a cross-sectional view of a part of the display device 10 in this embodiment. In FIG. 10, the maximum width W1 of the separated pattern 16' of the anisotropic conductive layer 16 is greater than the maximum width W2 of the contact electrode 26 of the light-emitting diode 14 to ensure the yield of bonding under the condition of providing sufficient maximum width W1 of the separated pattern 16' of the anisotropic conductive layer 16.

Figure 11:
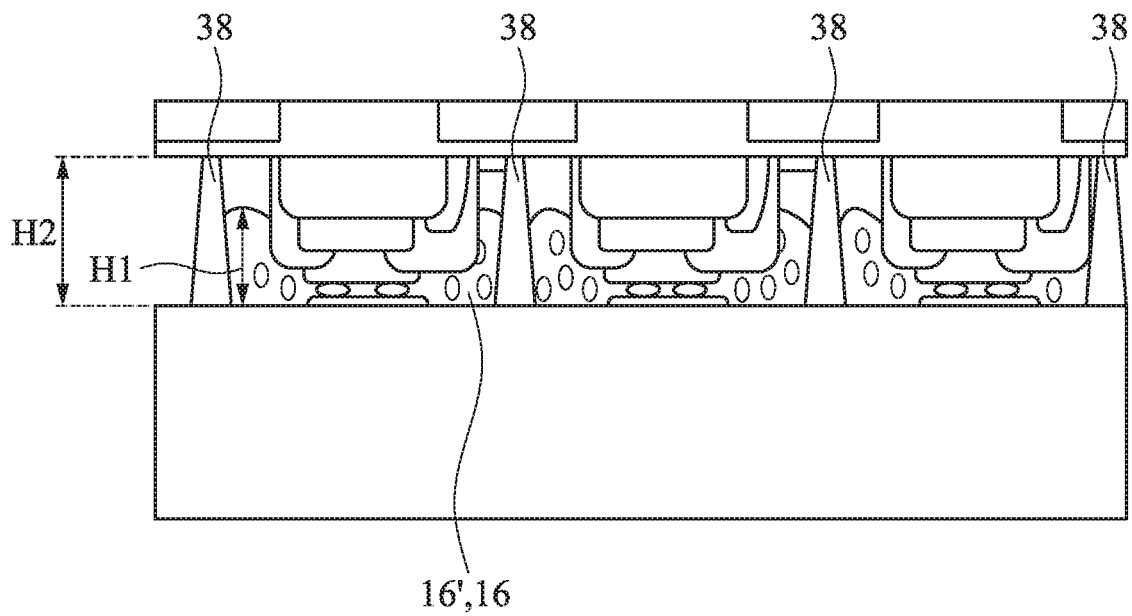
FIG. 11 is a cross-sectional view of a part of a display device in accordance with one embodiment of the disclosure.

In some embodiments, suitable size relationships between a height H2 of the black matrix 38 and the maximum height H1 of the separated pattern 16' of the anisotropic conductive layer 16 is provided, as shown in FIG. 11. FIG. 11 is a cross-sectional view of a part of the display device 10 in this embodiment. In FIG. 11, the height H2 of the black matrix 38 is greater than the maximum height H1 of the separated pattern 16' of the anisotropic conductive layer 16.

Figure 12:
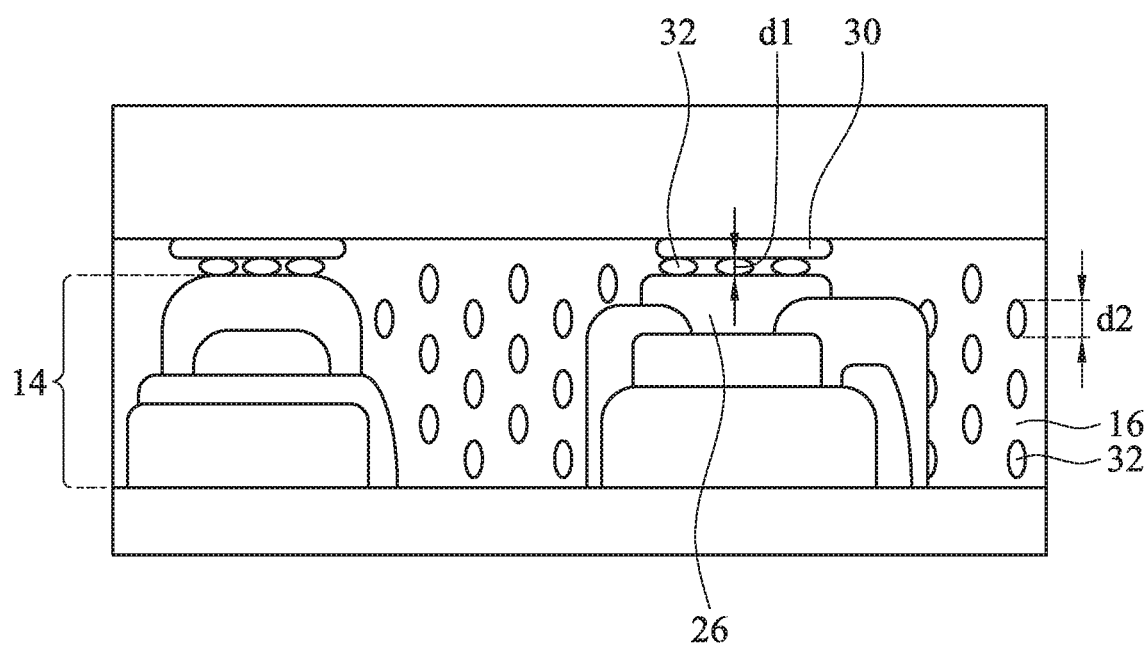
FIG. 12 is a cross-sectional view of a part of a display device in accordance with one embodiment of the disclosure.

In some embodiments, various profiles of the conductive particles 32 in the anisotropic conductive layer 16 while bonding are provided, as shown in FIG. 12. FIG. 12 is a cross-sectional view of a part of the display device 10 in this embodiment. In FIG. 12, the conductive particles 32 located between the contact electrode 26 of the light-emitting diode 14 and the bonding pad 30 are pressed thereby to generate profile deformation, resulting in the diameter d1 of the pressed conductive particles 32 smaller than the diameter d2 of the conductive particles 32 without pressing, which ensures that success of bonding is achieved.

Figure 13:
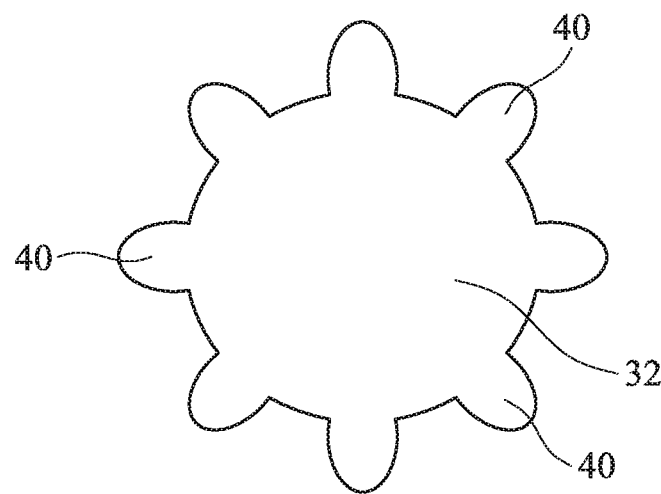
FIG. 13 shows a profile of a conductive particle in accordance with one embodiment of the disclosure.

In some embodiments, the conductive particle 32 has a plurality of protrusions 40 extending from the surface of the conductive particle 32, as shown in FIG. 13. FIG. 13 shows a profile of the conductive particle 32 in this embodiment. Referring to FIGS. 12 and 13, the protrusions 40 of the conductive particle 32 pierce the oxide layer formed on the surface of the contact electrode 26 and the bonding pad 30, effectively improving the effect of contact with each other.

Figure 14:
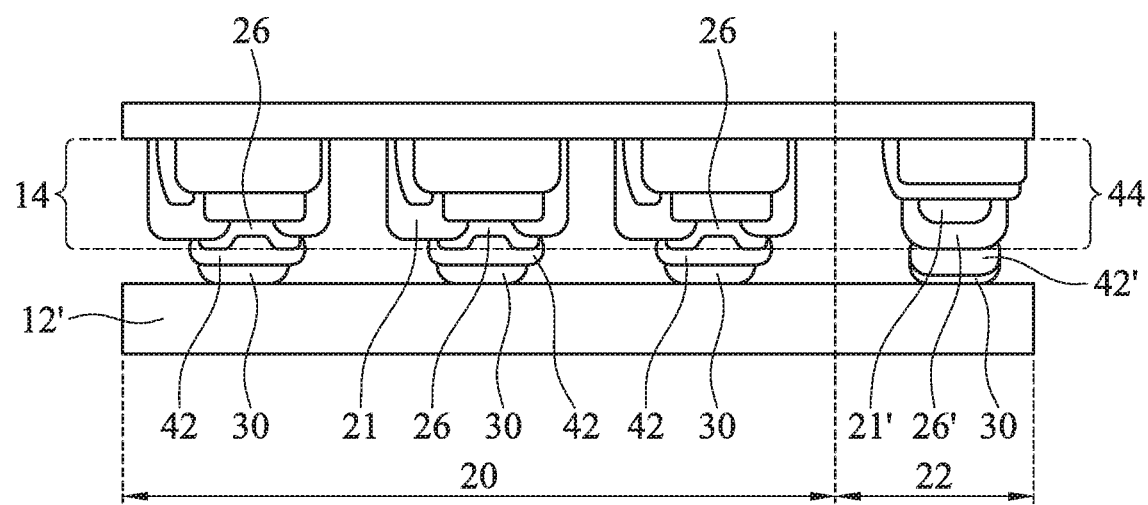
FIG. 14 is a cross-sectional view of a display device in accordance with one embodiment of the disclosure.

Referring to FIG. 14, in accordance with one embodiment of the disclosure, a display device 10 is provided. FIG. 14 is a cross-sectional view of the display device 10 in this embodiment.

As shown in FIG. 14, the display device 10 comprises a TFT substrate 12', a plurality of bonding pads 30, a plurality of light-emitting diodes 14 and a plurality of bumps (42, 42'). The TFT substrate 12' comprises a display area 20 and a non-display area 22 adjacent to the display area 20. The bonding pads 30 are disposed on the TFT substrate 12'. The light-emitting diodes 14 are disposed on the display area 20 of the TFT substrate 12' and correspond to the bonding pads 30. The light-emitting diode 14 comprises a contact electrode 26. The bumps 42 are disposed between the bonding pads 30 and the contact electrodes 26 of the light-emitting diodes 14.

In some embodiments, the display device 10 further comprises at least one connection structure 44. The connection structure 44 is disposed on the non-display area 22 and/or the display area 20 of the TFT substrate 12' and corresponds to the bonding pad 30. The connection structure 44 has a contact electrode 26'.

In this embodiment, the connection structure 44 comprises an insulating layer 21' which is separated from the light-emitting diodes 14 (i.e. separation from insulating layers 21 of the light-emitting diodes 14).

In some embodiments, the bump 42' is disposed between the bonding pad 30 and the contact electrode 26' of the connection structure 44.

In some embodiments, the bump 42' which is disposed between the bonding pad 30 and the contact electrode 26' of the connection structure 44. The bump 42' comprises the metal materials of the bonding pad 30 and the contact electrode 26'. The metal material of the bonding pad 30 comprises Cu, Sn, In, Pb or alloy thereof. The metal material of the contact electrode 26' comprises Cu, Al, Mo, Ti, Ni or alloy thereof. Additionally, the bump 42 which is disposed between the bonding pad 30 and the contact electrode 26 of the light-emitting diode 14. The bump 42 comprises the metal materials of the bonding pad 30 and the contact electrode 26. The metal material of the bonding pad 30 comprises Cu, Sn, In, Pb or alloy thereof. The metal material of the contact electrode 26 comprises Cu, Al, Mo, Ti, Ni or alloy thereof.

Referring to FIGS. 15A-15H, in accordance with one embodiment of the disclosure, a method for fabricating the display device 10 is provided. FIGS. 15A-15H are cross-sectional views of the method for fabricating the display device 10 in this embodiment.

Figure 15:
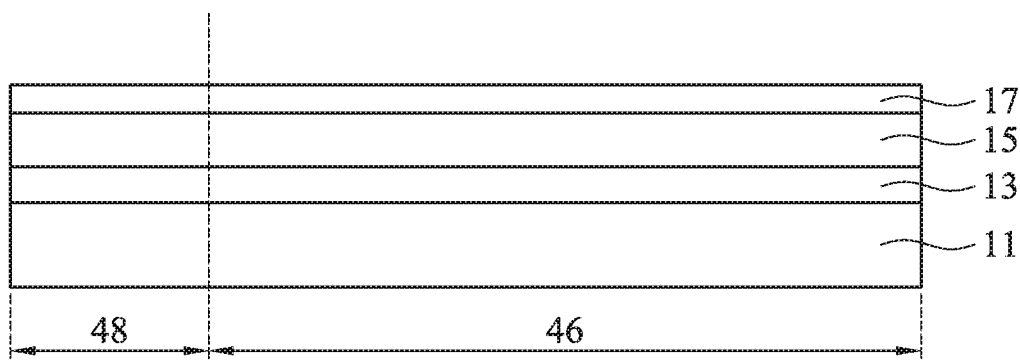
FIGS. 15A-15H are cross-sectional views of a method for fabricating a display device in accordance with one embodiment of the disclosure.
Figure 15:
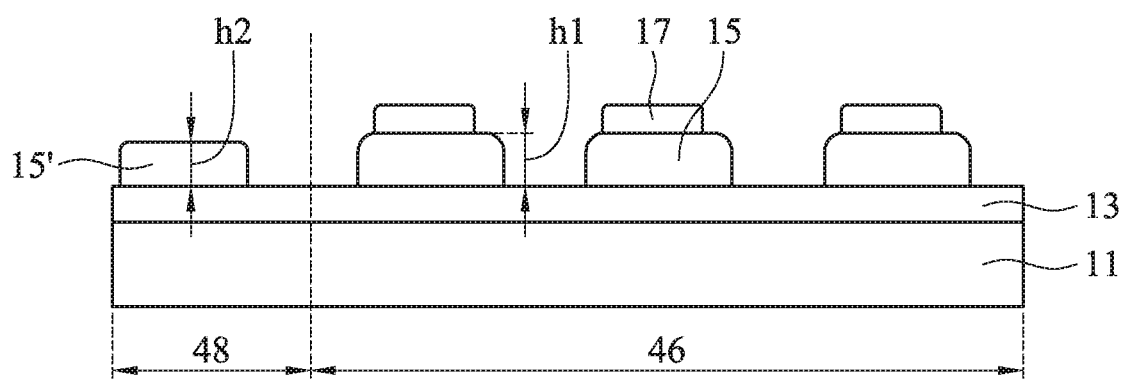
Figure 15:
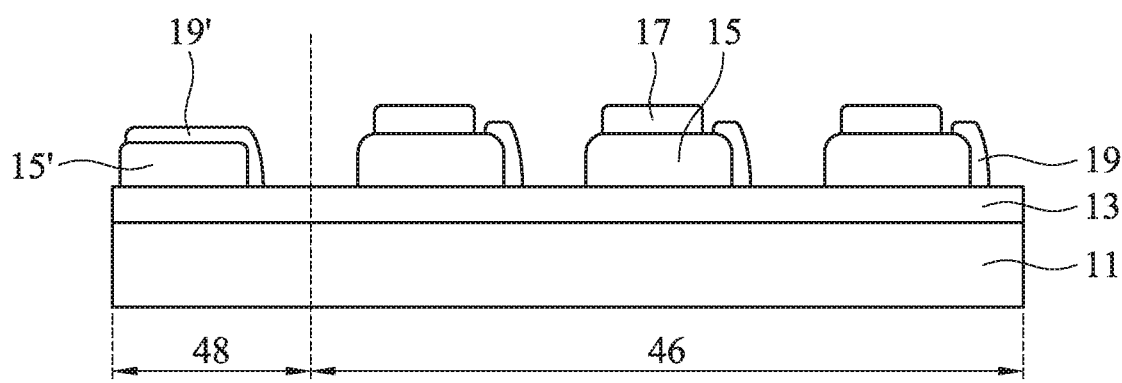
Figure 15:
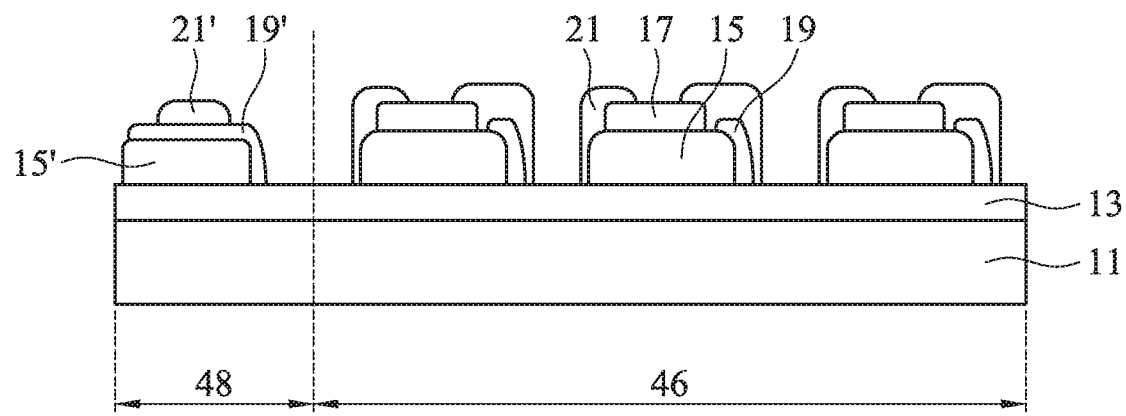
Figure 15:
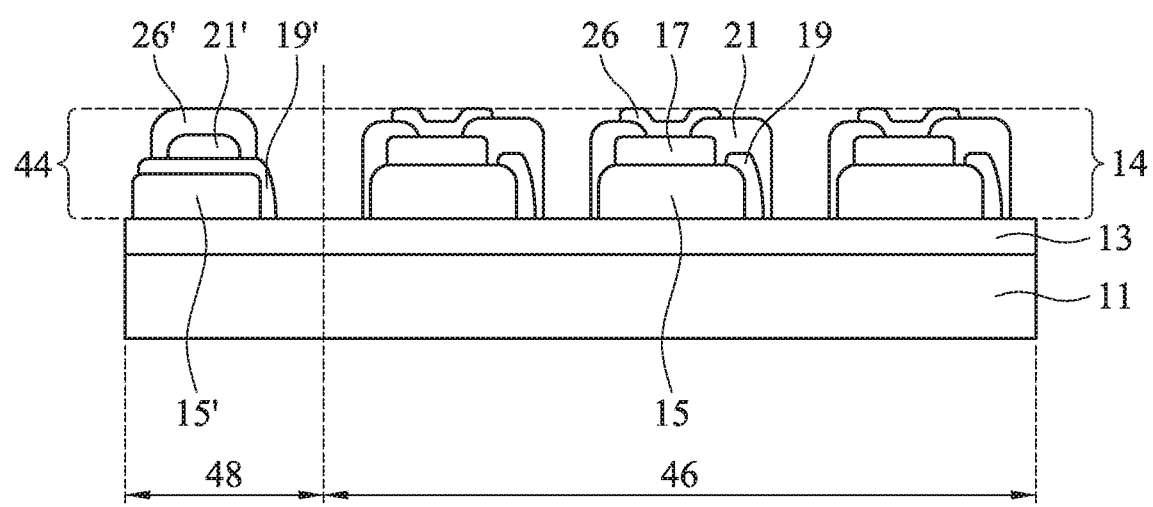
Figure 15:
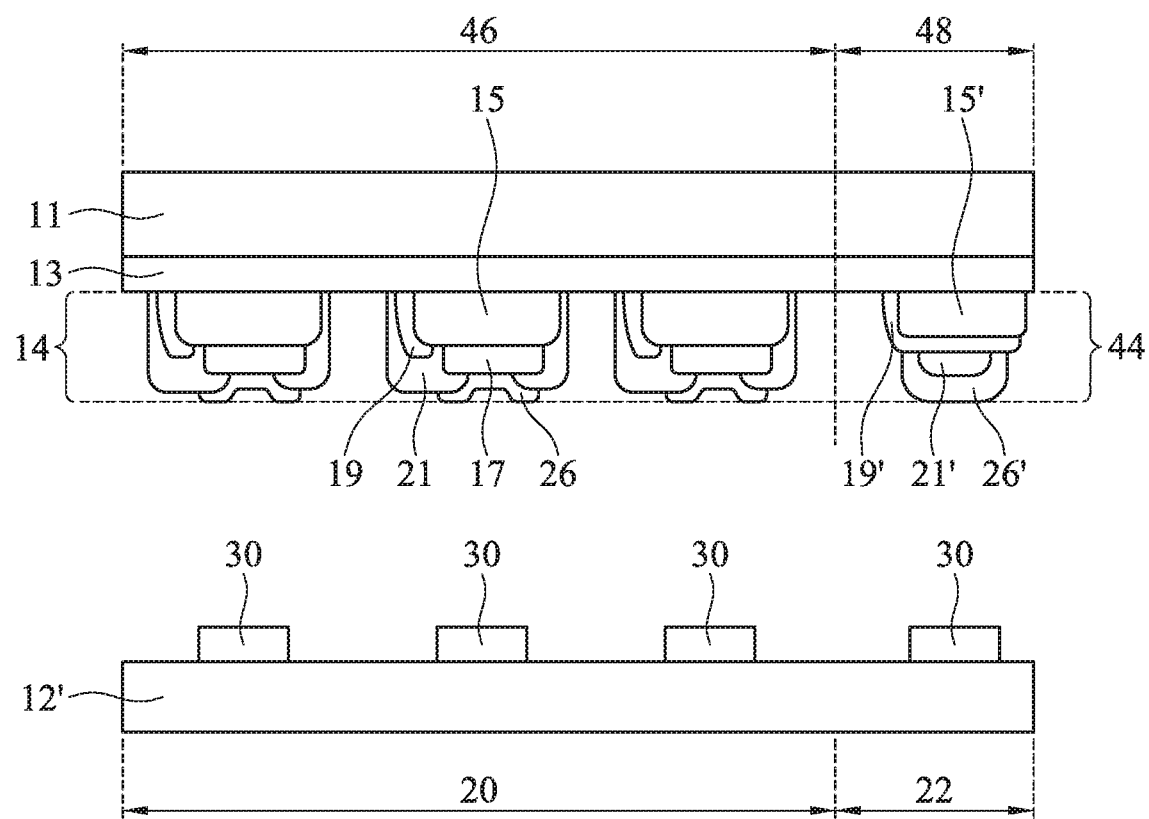
Figure 15:
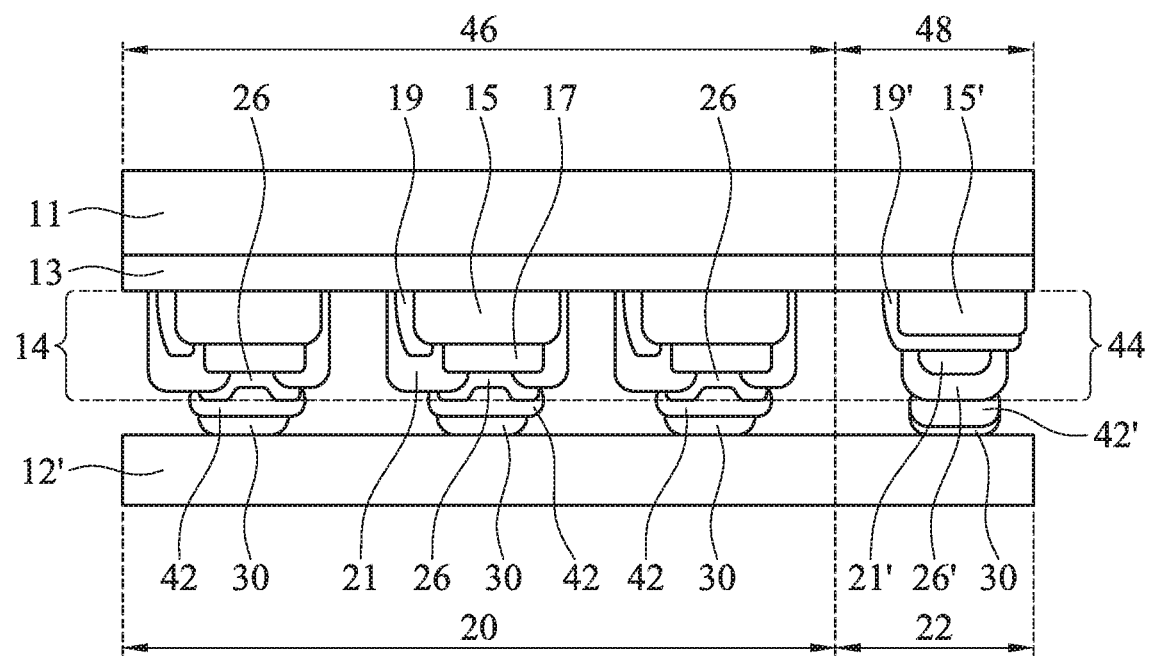
Figure 15:
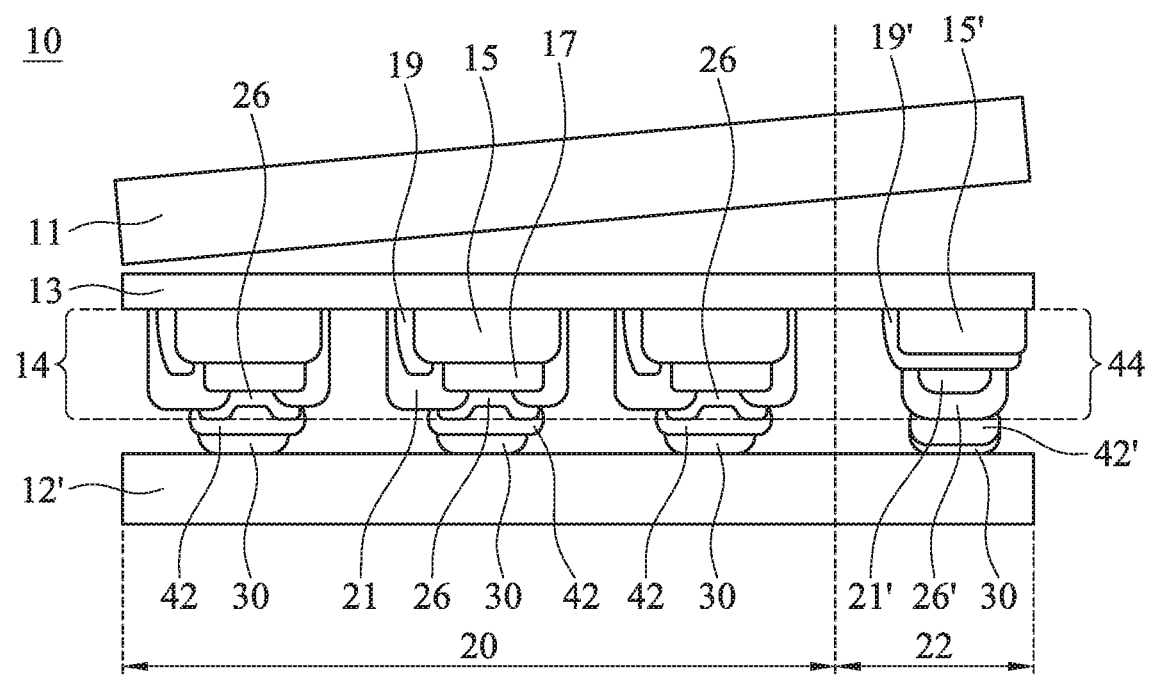

As shown in FIG. 15A, a wafer substrate 11 with an un-doped gallium nitride layer 13, an N-type semiconductor layer 15 and a P-type semiconductor layer 17 formed thereon in order is provided. The un-doped gallium nitride layer 13 is formed on the wafer substrate 11. The N-type semiconductor layer 15 is formed on the un-doped gallium nitride layer 13. The P-type semiconductor layer 17 is formed on the N-type semiconductor layer 15. The wafer substrate 11 comprises a central area 46 and a peripheral area 48 adjacent to the central area 46. In some embodiments, multiple quantum wells (not shown) are further formed between the N-type semiconductor layer 15 and the P-type semiconductor layer 17.

As shown in FIG. 15B, the P-type semiconductor layer 17 and the N-type semiconductor layer 15 are then etched to respectively form a stack of the patterned N-type semiconductor layer 15 and the patterned P-type semiconductor layer 17 at the central area 46, and another patterned N-type semiconductor layer 15' at the peripheral area 48. Specifically, the thickness h1 of the patterned N-type semiconductor layer 15 at the central area 46 is greater than the thickness h2 of the patterned N-type semiconductor layer 15' at the peripheral area 48.

As shown in FIG. 15C, a lower electrode 19 is then formed on a part of the patterned N-type semiconductor layer 15 at the central area 46. Another lower electrode 19' is simultaneously formed on the patterned N-type semiconductor layer 15' at the peripheral area 48. In this embodiment, the lower electrode 19 at the central area 46 and the lower electrode 19' at the peripheral area 48 are the same material.

As shown in FIG. 15D, an insulating layer 21 is then formed on the patterned N-type semiconductor layer 15, a part of the patterned P-type semiconductor layer 17, and the lower electrode 19 at the central area 46. Another insulating layer 21' is simultaneously formed on the lower electrode 19' at the peripheral area 48. In this embodiment, the insulating layer 21 at the central area 46 and the insulating layer 21' at the peripheral area 48 are the same material.

As shown in FIG. 15E, an upper electrode (a contact electrode) 26 is then formed on the insulating layer 21 and in contact with the patterned P-type semiconductor layer 17 at the central area 46. Simultaneously, another upper electrode (another contact electrode) 26' is formed on the insulating layer 21' and in contact with the lower electrode 19' at the peripheral area 48. Therefore, the wafer substrate 11 with a plurality of light-emitting diodes 14 formed at the central area 46 and at least one connection structure 44 formed at the peripheral area 48 is fabricated.

As shown in FIG. 15F, a TFT substrate 12' with a plurality of bonding pads 30 formed thereon is provided. The TFT substrate 12' comprises a display area 20 and a non-display area 22 adjacent to the display area 20. The display area 20 and the non-display area 22 of the TFT substrate 12' respectively correspond to the central area 46 and the peripheral area 48 of the wafer substrate 11.

As shown in FIG. 15G, the TFT substrate 12' is then bonded to the wafer substrate 11 by performing a fusion process. During the fusion process, the bonding pads 30 of the TFT substrate 12' and the upper electrodes 26 of the light-emitting diodes 14 are fused at the display area 20. The bonding pad 30 of the TFT substrate 12' and the upper electrode 26' of the connection structure 44 are fused at the non-display area 22.

As shown in FIG. 15H, the wafer substrate 11 is then removed.

Figure 16:
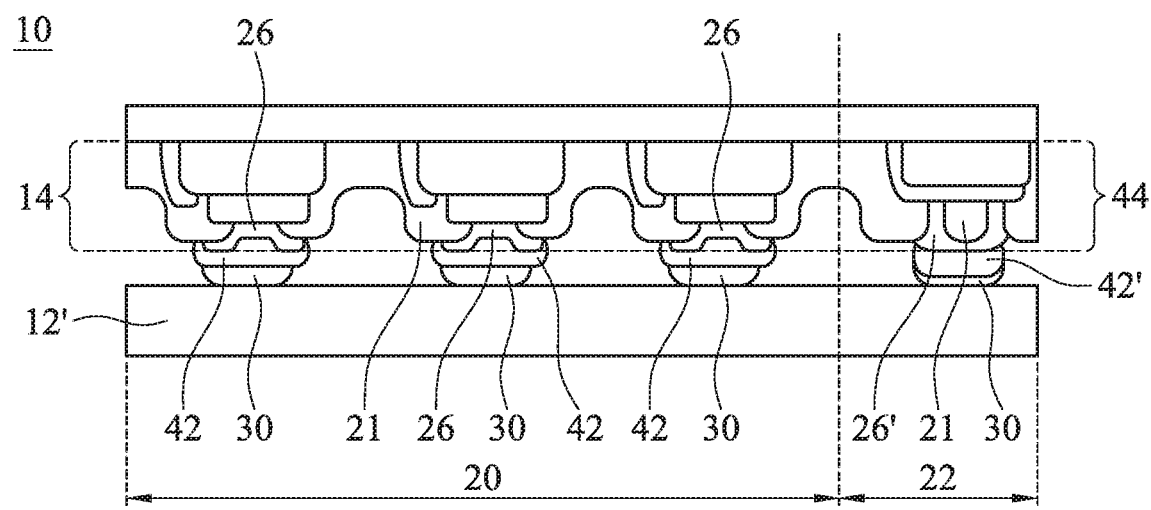
FIG. 16 is a cross-sectional view of a display device in accordance with one embodiment of the disclosure.

Referring to FIG. 16, in accordance with one embodiment of the disclosure, a display device 10 is provided. FIG. 16 is a cross-sectional view of the display device 10 in this embodiment.

As shown in FIG. 16, the display device 10 comprises a TFT substrate 12', a plurality of bonding pads 30, a plurality of light-emitting diodes 14 and a plurality of bumps (42, 42'). The TFT substrate 12' comprises a display area 20 and a non-display area 22 adjacent to the display area 20. The bonding pads 30 are disposed on the TFT substrate 12'. The light-emitting diodes 14 are disposed on the display area 20 of the TFT substrate 12' and correspond to the bonding pads 30. The light-emitting diode 14 comprises a contact electrode 26. The bumps 42 are disposed between the bonding pads 30 and the contact electrodes 26 of the light-emitting diodes 14.

In some embodiments, the display device 10 further comprises at least one connection structure 44. The connection structure 44 is disposed on the non-display area 22 and/or the display area 20 of the TFT substrate 12' and corresponds to the bonding pad 30. The connection structure 44 has a contact electrode 26'.

In this embodiment, the connection structure 44 comprises an insulating layer 21 which is extended to cover part of the light-emitting diodes 14 (i.e. acted as the insulating layer of the light-emitting diodes 14).

In some embodiments, the bump 42' is disposed between the bonding pad 30 and the contact electrode 26' of the connection structure 44.

In some embodiments, the bump 42' which is disposed between the bonding pad 30 and the contact electrode 26' of the connection structure 44. The bump 42' comprises the metal materials of the bonding pad 30 and the contact electrode 26'. The metal material of the bonding pad 30 comprises Cu, Sn, In, Pb or alloy thereof. The metal material of the contact electrode 26' comprises Cu, Al, Mo, Ti, Ni or alloy thereof. Additionally, the bump 42 which is disposed between the bonding pad 30 and the contact electrode 26 of the light-emitting diode 14. The bump 42 comprises the metal materials of the bonding pad 30 and the contact electrode 26. The metal material of the bonding pad 30 comprises Cu, Sn, In, Pb or alloy thereof. The metal material of the contact electrode 26 comprises Cu, Al, Mo, Ti, Ni or alloy thereof.

Referring to FIGS. 17A-17E in accordance with one embodiment of the disclosure, a method for fabricating the display device 10 is provided. FIGS. 17A-17E are cross-sectional views of the method for fabricating the display device 10 in this embodiment.

The fabrication of the display device 10, before an insulating layer 21 is formed, is referred to FIGS. 15A-15C.

Figure 17A:
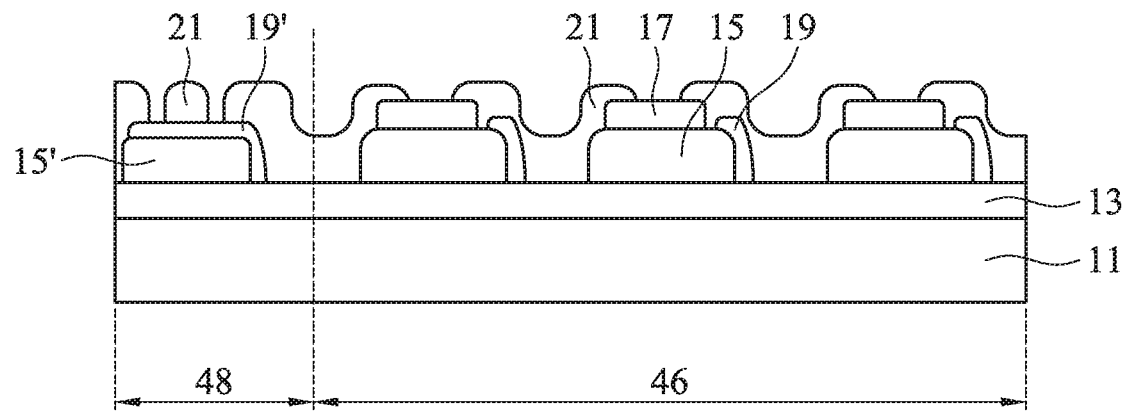
FIGS. 17A-17E are cross-sectional views of a method for fabricating a display device in accordance with one embodiment of the disclosure.

As shown in FIG. 17A, an insulating layer 21 is then formed on the patterned N-type semiconductor layer 15, a part of the patterned P-type semiconductor layer 17, and the lower electrode 19 at the central area 46. Simultaneously, the insulating layer 21 is extended to form on the lower electrode 19' at the peripheral area 48. In this embodiment, the insulating layer 21 is extended from the central area 46 to the peripheral area 48.

Figure 17B:
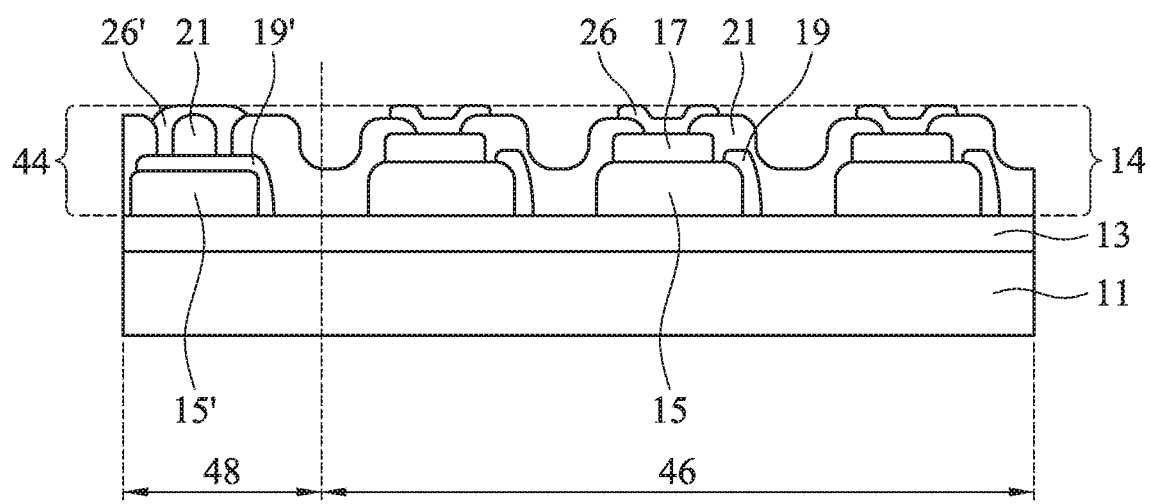

As shown in FIG. 17B, an upper electrode (a contact electrode) 26 is then formed on the insulating layer 21 and in contact with the patterned P-type semiconductor layer 17 at the central area 46. Simultaneously, another upper electrode (another contact electrode) 26' is formed on the insulating layer 21 and in contact with the lower electrode 19' at the peripheral area 48. Therefore, the wafer substrate 11 with a plurality of light-emitting diodes 14 formed at the central area 46 and at least one connection structure 44 formed at the peripheral area 48 is fabricated.

Figure 17C:
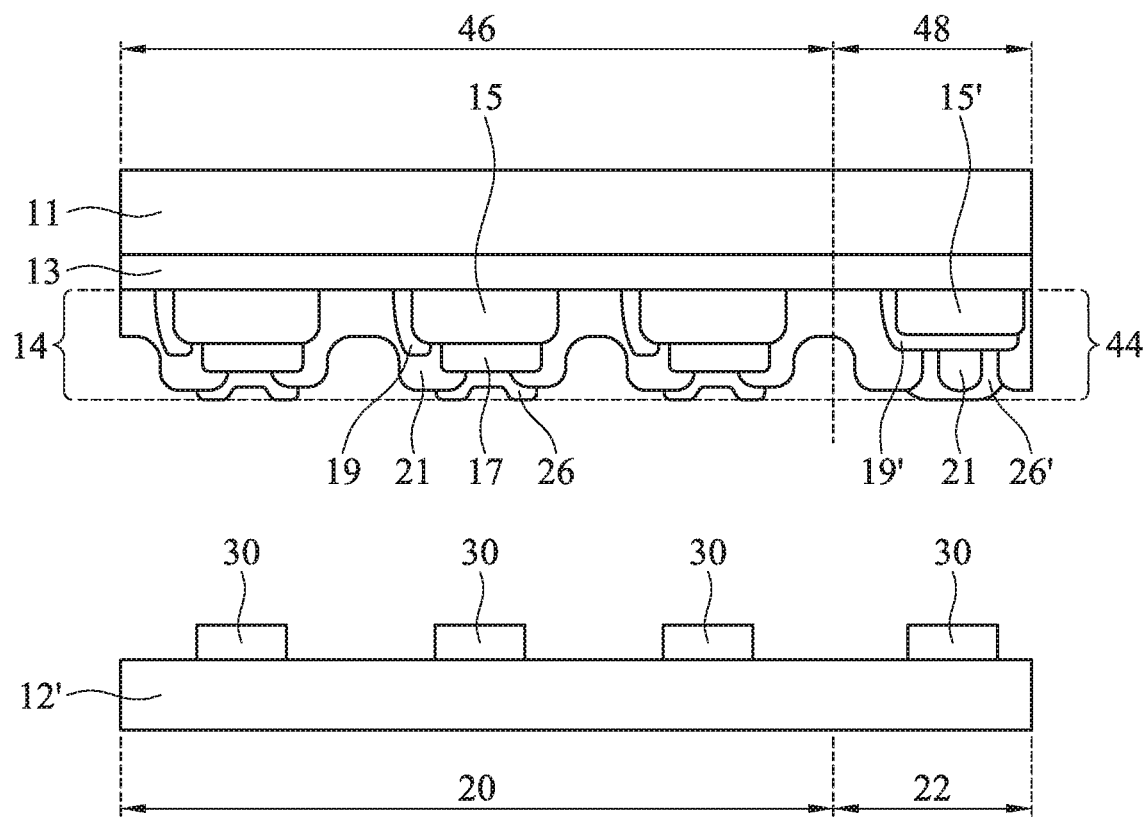

As shown in FIG. 17C, a TFT substrate 12' with a plurality of bonding pads 30 formed thereon is provided. The TFT substrate 12' comprises a display area 20 and a non-display area 22 adjacent to the display area 20. The display area 20 and the non-display area 22 of the TFT substrate 12' respectively correspond to the central area 46 and the peripheral area 48 of the wafer substrate 11.

Figure 17D:
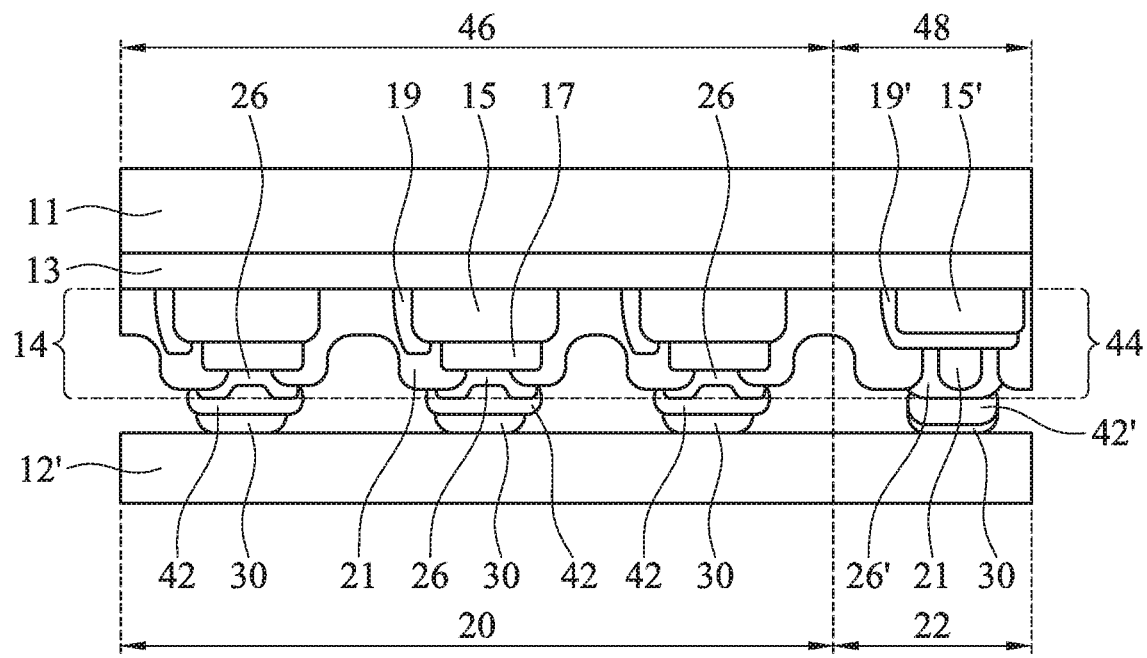

As shown in FIG. 17D, the TFT substrate 12' is then bonded to the wafer substrate 11 by performing a fusion process. During the fusion process, the bonding pads 30 of the TFT substrate 12' and the upper electrodes 26 of the light-emitting diodes 14 are fused at the display area 20. The bonding pad 30 of the TFT substrate 12' and the upper electrode 26' of the connection structure 44 are fused at the non-display area 22.

Figure 17E:
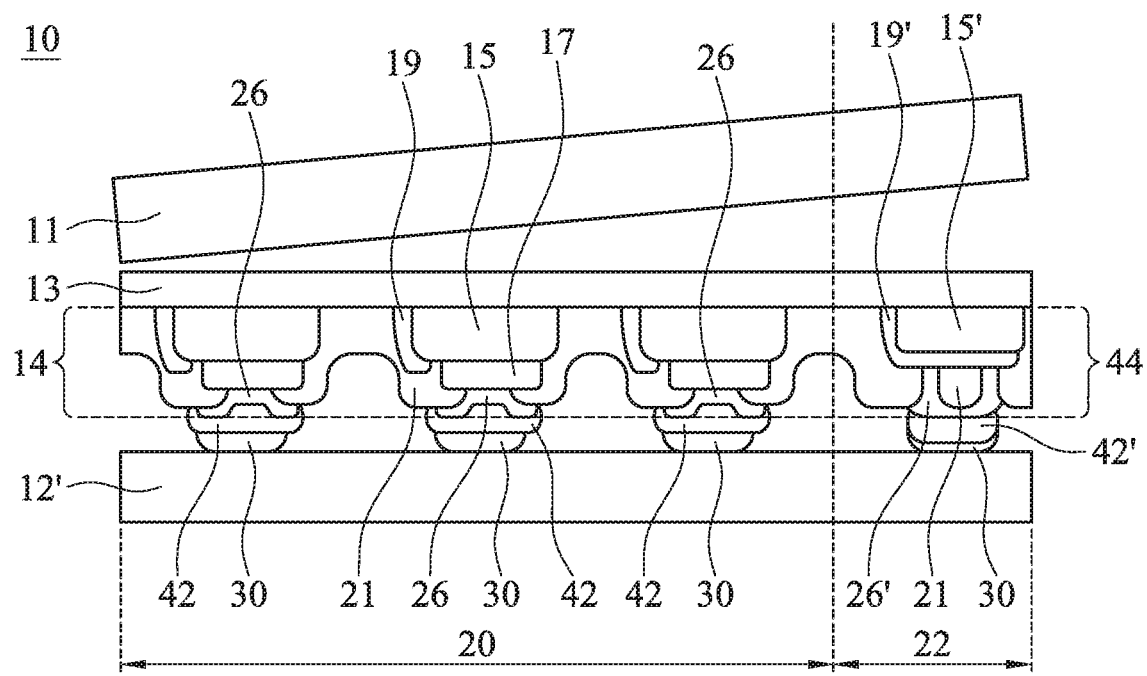

As shown in FIG. 17E, the wafer substrate 11 is then removed.

Figure 18A:
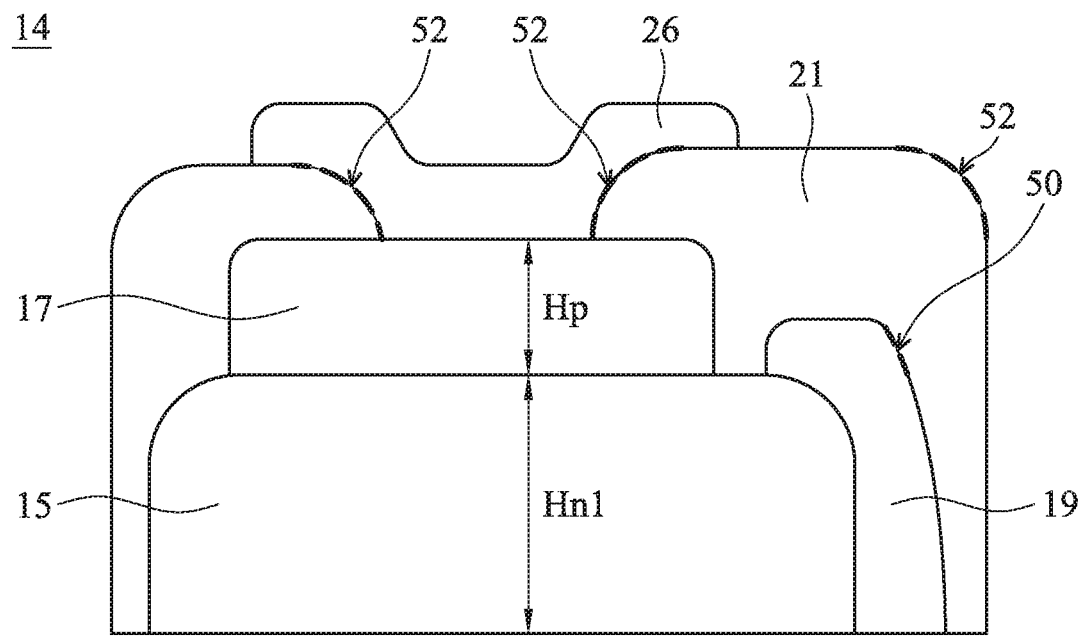
FIG. 18A is a cross-sectional view of a light-emitting diode in accordance with one embodiment of the disclosure.
Figure 18B:
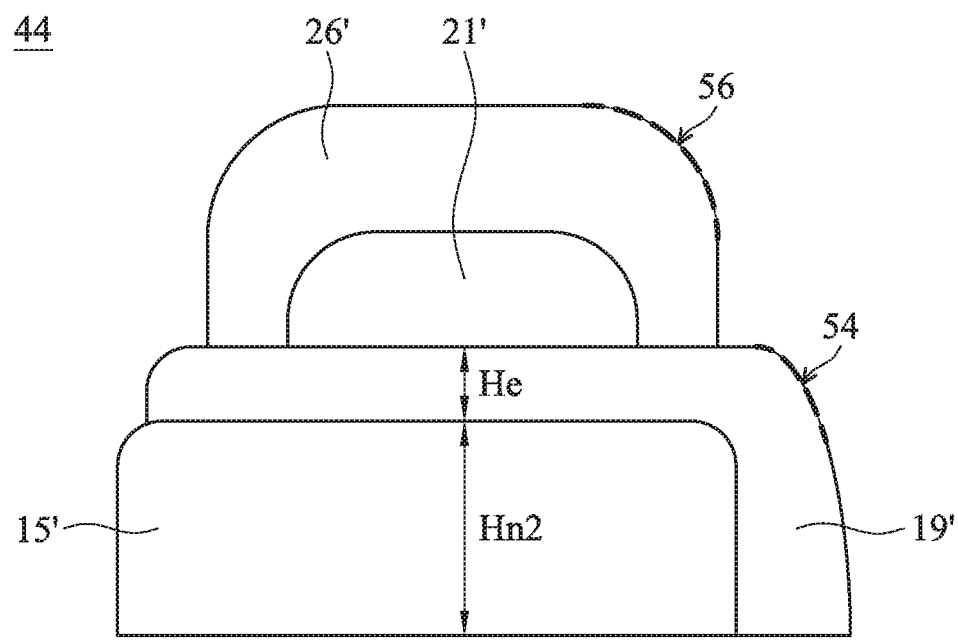
FIG. 18B is a cross-sectional view of a connection structure in accordance with one embodiment of the disclosure.

In some embodiments, suitable profiles and size relationships of the elements between the light-emitting diode 14 and the connection structure 44 are provided, as shown in FIGS. 18A and 18B. FIG. 18A is a cross-sectional view of the light-emitting diode 14. FIG. 18B is a cross-sectional view of the connection structure 44 in this embodiment.

In FIG. 18A, the light-emitting diode 14 comprises the N-type semiconductor layer 15 having a thickness Hn1, the P-type semiconductor layer 17 having a thickness Hp, the lower electrode 19, the insulating layer 21 and the upper electrode (contact electrode) 26. The P-type semiconductor layer 17 is disposed on the N-type semiconductor layer 15. The lower electrode 19 is disposed on a part of the N-type semiconductor layer 15. The insulating layer 21 is disposed on the N-type semiconductor layer 15, a part of the P-type semiconductor layer 17 and the lower electrode 19. The upper electrode (contact electrode) 26 is disposed on the insulating layer 21 and in contact with the P-type semiconductor layer 17.

In FIG. 18B, the connection structure 44 comprises the N-type semiconductor layer 15' having a thickness Hn2, the lower electrode 19' having a thickness He, the insulating layer 21' and the upper electrode (contact electrode) 26'. The lower electrode 19' is disposed on the N-type semiconductor layer 15'. The insulating layer 21' is disposed on the lower electrode 19'. The upper electrode (contact electrode) 26' is disposed on the insulating layer 21' and in contact with the lower electrode 19'.

Specifically, the edges of the elements of the light-emitting diode 14 and the connection structure 44 are formed into the shape of a curve by adjusting parameters of etching processes to effectively reduce phenomenon of electrostatic discharge (ESD) produced from charge accumulation. For example, the edge 50 of the lower electrode 19 and the edges 52 of the insulating layer 21 of the light-emitting diode 14 are formed into a curved shape, as shown in FIG. 18A. Also, the edge 54 of the lower electrode 19' and the edge 56 of the upper electrode (contact electrode) 26' of the connection structure 44 are formed into the shape of a curve, as shown in FIG. 18B.

Additionally, the thickness Hn1 of the N-type semiconductor layer 15 of the light-emitting diode 14 is greater than the thickness Hn2 of the N-type semiconductor layer 15' of the connection structure 44 to ensure that there is no residue of P-type semiconductor layer on the N-type semiconductor layer 15' in the connection structure 44. Furthermore, a ratio between the sum of the thickness Hn2 of the N-type semiconductor layer 15' and the thickness He of the lower electrode 19' of the connection structure 44 and the sum of the thickness Hn1 of the N-type semiconductor layer 15 and the thickness Hp of the P-type semiconductor layer 17 of the light-emitting diode 14 is from about 0.9 to about 1.1 to avoid formation of thickness difference between the light-emitting diode 14 and the connection structure 44 and ensure good contact between the elements, improving the yield.

Figure 19A:
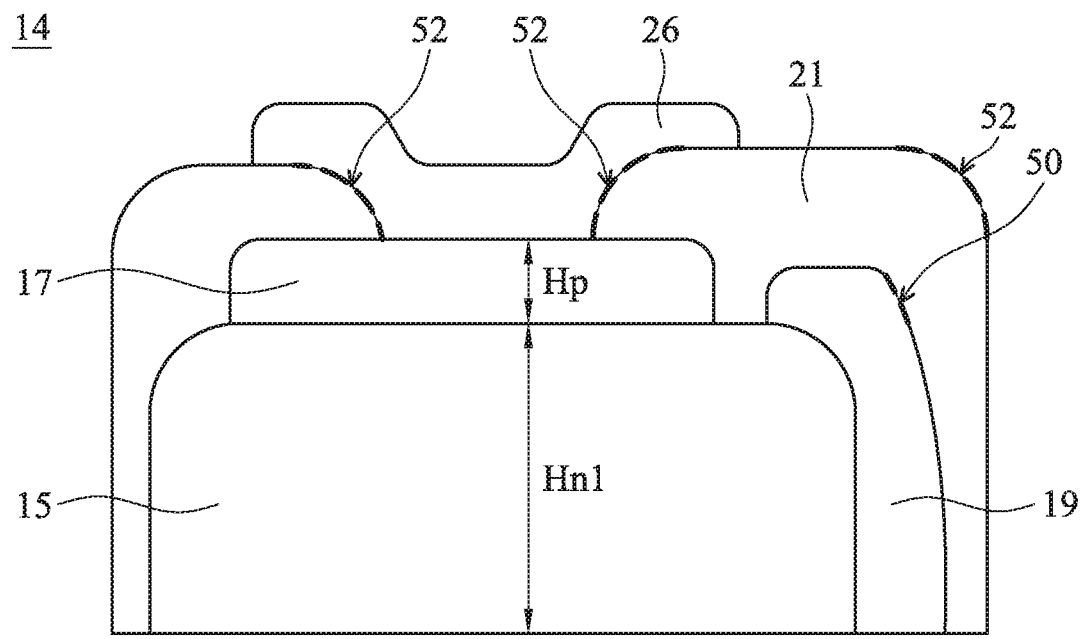
FIG. 19A is a cross-sectional view of a light-emitting diode in accordance with one embodiment of the disclosure.
Figure 19B:
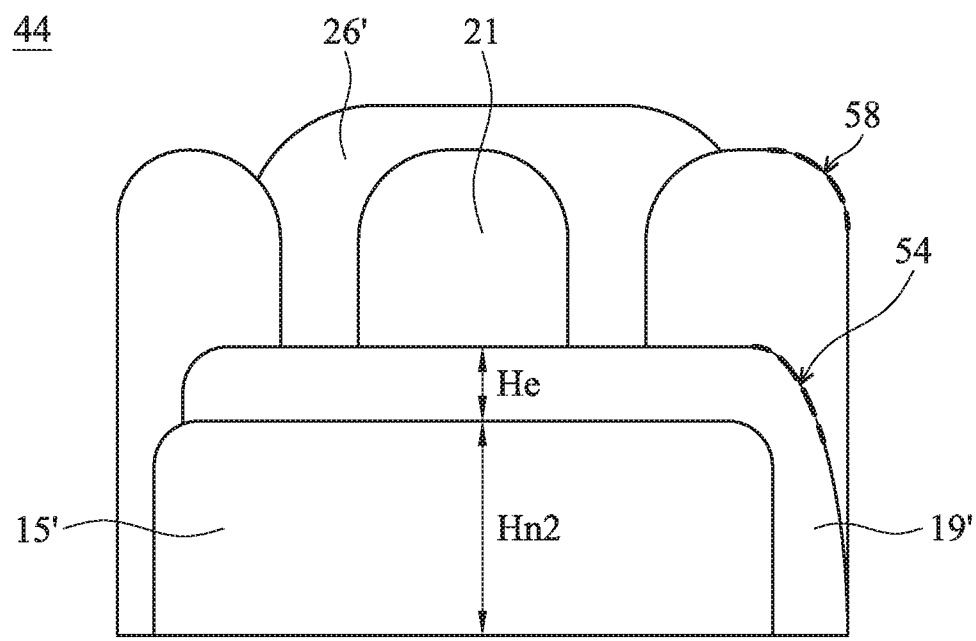
FIG. 19B is a cross-sectional view of a connection structure in accordance with one embodiment of the disclosure.

In some embodiments, other suitable profiles and size relationships of the elements between the light-emitting diode 14 and the connection structure 44 are also provided, as shown in FIGS. 19A and 19B. FIG. 19A is a cross-sectional view of the light-emitting diode 14. FIG. 19B is a cross-sectional view of the connection structure 44 in this embodiment.

In FIG. 19A, the light-emitting diode 14 comprises the N-type semiconductor layer 15 having a thickness Hn1, the P-type semiconductor layer 17 having a thickness Hp, the lower electrode 19, the insulating layer 21 and the upper electrode (contact electrode) 26. The P-type semiconductor layer 17 is disposed on the N-type semiconductor layer 15. The lower electrode 19 is disposed on a part of the N-type semiconductor layer 15. The insulating layer 21 is disposed on the N-type semiconductor layer 15, a part of the P-type semiconductor layer 17 and the lower electrode 19. The upper electrode (contact electrode) 26 is disposed on the insulating layer 21 and in contact with the P-type semiconductor layer 17.

In FIG. 19B, the connection structure 44 comprises the N-type semiconductor layer 15' having a thickness Hn2, the lower electrode 19' having a thickness He, the insulating layer 21 and the upper electrode (contact electrode) 26'. The lower electrode 19' is disposed on the N-type semiconductor layer 15'. The insulating layer 21 is disposed on the lower electrode 19' and the N-type semiconductor layer 15'. The upper electrode (contact electrode) 26' is disposed on the insulating layer 21 and in contact with the lower electrode 19'.

Specifically, the edges of the elements of the light-emitting diode 14 and the connection structure 44 are formed into a curved shape by adjusting parameters of etching processes to effectively reduce phenomenon of electrostatic discharge (ESD) produced from charge accumulation. For example, the edge 50 of the lower electrode 19 and the edges 52 of the insulating layer 21 of the light-emitting diode 14 are formed into the shape of a curve, as shown in FIG. 19A. Also, the edge 54 of the lower electrode 19' and the edge 58 of the insulating layer 21 of the connection structure 44 are formed into a curved shape, as shown in FIG. 19B.

Additionally, the thickness Hn1 of the N-type semiconductor layer 15 of the light-emitting diode 14 is greater than the thickness Hn2 of the N-type semiconductor layer 15' of the connection structure 44. Furthermore, a ratio between the sum of the thickness Hn2 of the N-type semiconductor layer 15' and the thickness He of the lower electrode 19' of the connection structure 44 and the sum of the thickness Hn1 of the N-type semiconductor layer 15 and the thickness Hp of the P-type semiconductor layer 17 of the light-emitting diode 14 is from about 0.9 to about 1.1.

Figure 20:
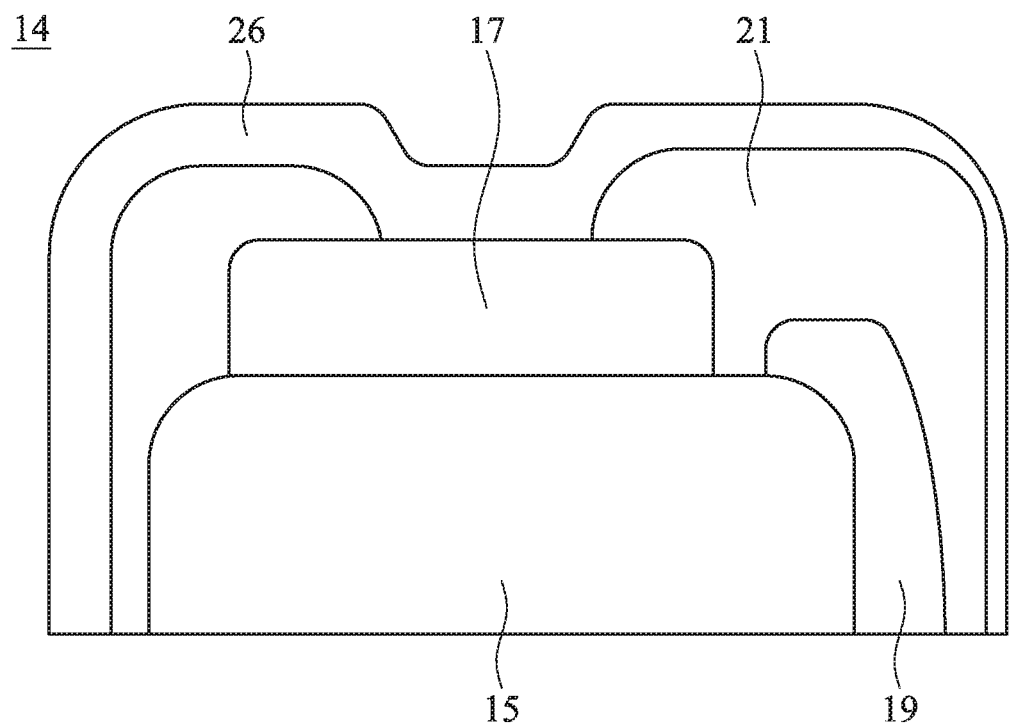
FIG. 20 is a cross-sectional view of a light-emitting diode in accordance with one embodiment of the disclosure.

In some embodiments, other profiles of the elements of the light-emitting diode 14 are provided, as shown in FIG. 20. FIG. 20 is a cross-sectional view of the light-emitting diode 14. In FIG. 20, the light-emitting diode 14 comprises the N-type semiconductor layer 15, the P-type semiconductor layer 17, the lower electrode 19, the insulating layer 21 and the upper electrode (contact electrode) 26. The P-type semiconductor layer 17 is disposed on the N-type semiconductor layer 15. The lower electrode 19 is disposed on a part of the N-type semiconductor layer 15. The insulating layer 21 is disposed on the N-type semiconductor layer 15, a part of the P-type semiconductor layer 17 and the lower electrode 19. Specifically, the upper electrode (contact electrode) 26 overlies the insulating layer 21 and extends to the wafer substrate. The upper electrode (contact electrode) 26 can be used as a reflective plate to concentrate the light emitted.

Figure 21:
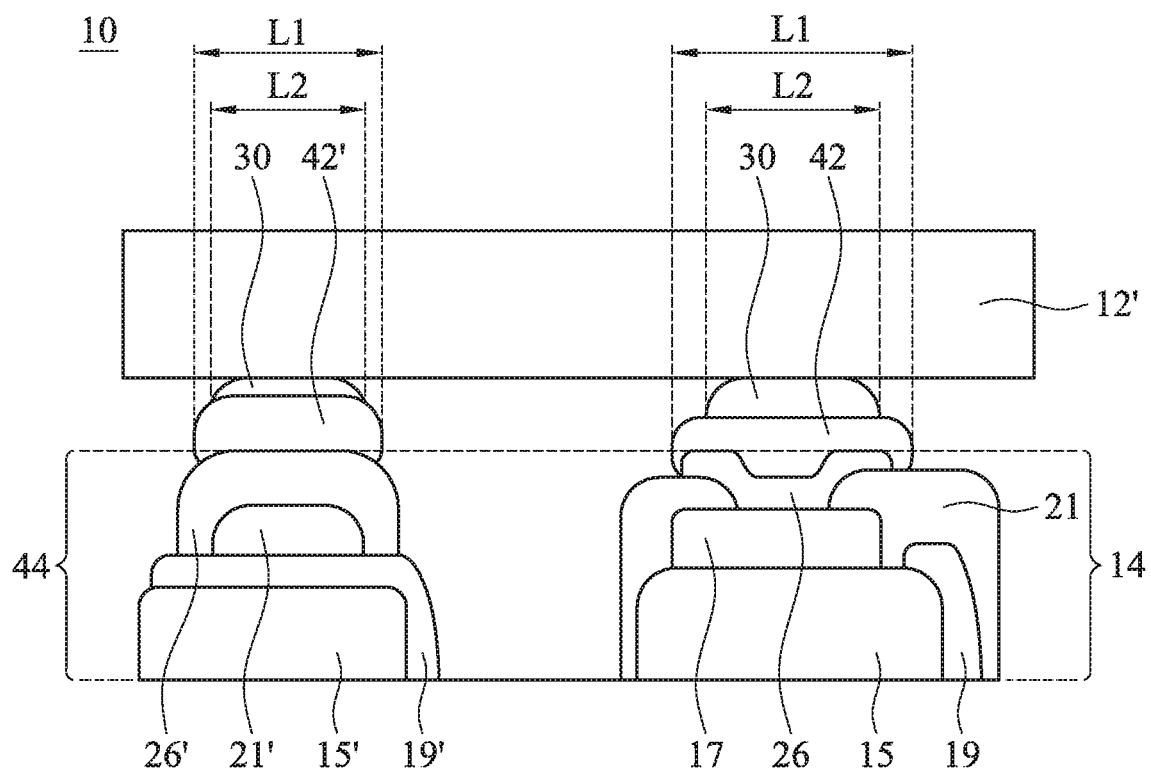
FIG. 21 is a cross-sectional view of a part of a display device in accordance with one embodiment of the disclosure.

In some embodiments, suitable size relationships between the bonding pads 30 and the bumps (42, 42') in the display device 10 are provided, as shown in FIG. 21. FIG. 21 is a cross-sectional view of a part of the display device 10 in this embodiment.

In FIG. 21, the light-emitting diode 14 comprises the N-type semiconductor layer 15, the P-type semiconductor layer 17, the lower electrode 19, the insulating layer 21 and the upper electrode (contact electrode) 26. The P-type semiconductor layer 17 is disposed on the N-type semiconductor layer 15. The lower electrode 19 is disposed on a part of the N-type semiconductor layer 15. The insulating layer 21 is disposed on the N-type semiconductor layer 15, a part of the P-type semiconductor layer 17 and the lower electrode 19. The upper electrode (contact electrode) 26 is disposed on the insulating layer 21 and in contact with the P-type semiconductor layer 17. The light-emitting diode 14 is further bonded with the bonding pad 30 of the TFT substrate 12' through the bump 42. The connection structure 44 comprises the N-type semiconductor layer 15', the lower electrode 19', the insulating layer 21' and the upper electrode (contact electrode) 26'. The lower electrode 19' is disposed on the N-type semiconductor layer 15'. The insulating layer 21' is disposed on the lower electrode 19'. The upper electrode (contact electrode) 26' is disposed on the insulating layer 21' and in contact with the lower electrode 19'. The connection structure 44 is further bonded with the bonding pad 30 of the TFT substrate 12' through the bump 42'.

Figure 22:
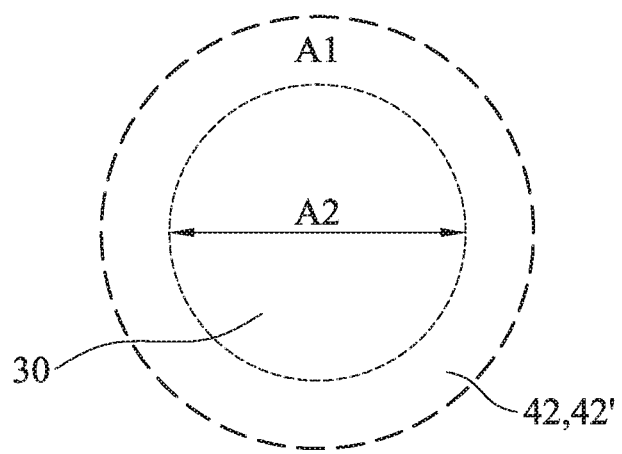
FIG. 22 is a top view of a bonding pad and a bump in accordance with one embodiment of the disclosure.

Specifically, the width L1 of the bumps (42, 42') is greater than the width L2 of the bonding pads 30. Furthermore, the projection area A1 of the bumps (42, 42') is greater than the projection area A2 of the bonding pads 30, as shown in FIG. 22. FIG. 22 is a top view of the bonding pads 30 and the bumps (42, 42') in this embodiment. The width L1 and the projection area A1 of the bumps (42, 42') which is greater than the width L2 and the projection area A2 of the bonding pads 30 in the display device 10 express that the bonding pads 30 and the upper electrode (contact electrode) (26, 26') have been effectively fused with each other and well electrical conduction therebetween well be achieved by the bumps (42, 42').

Figure 23:
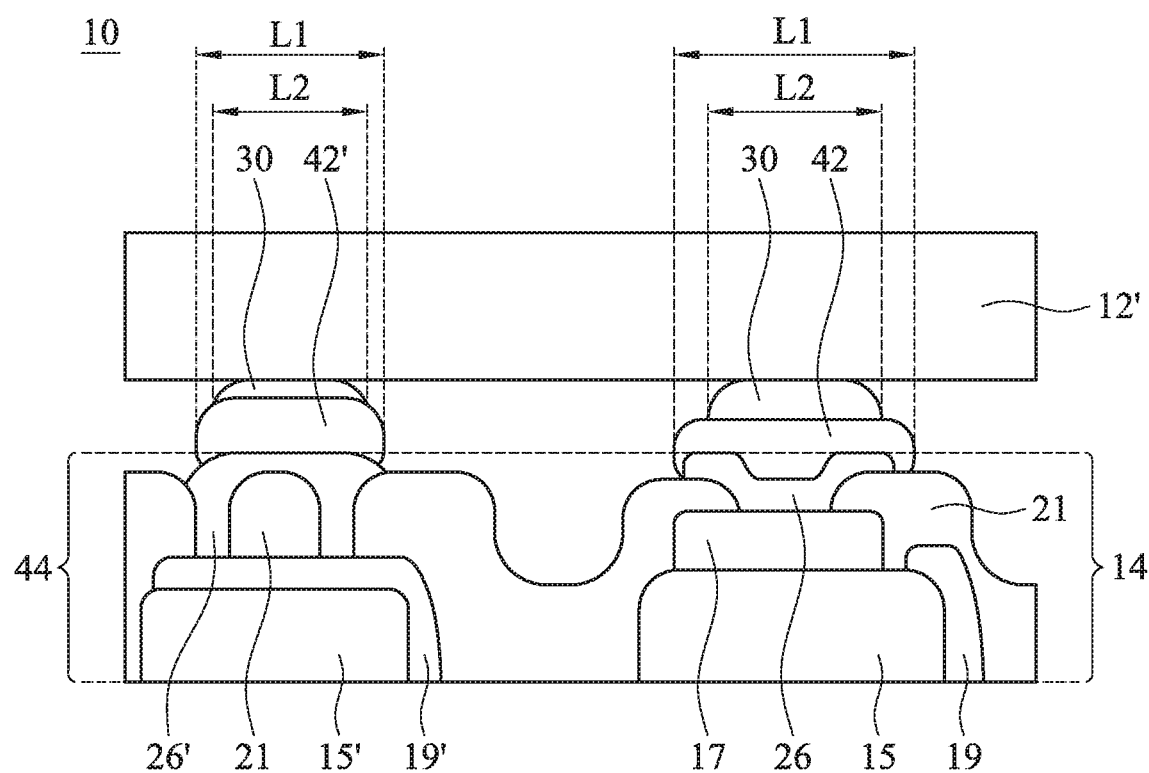
FIG. 23 is a cross-sectional view of a part of a display device in accordance with one embodiment of the disclosure.

In some embodiments, suitable size relationships between the bonding pads 30 and the bumps (42, 42') in another display device 10 are also provided, as shown in FIG. 23. FIG. 23 is a cross-sectional view of a part of the another display device 10 in this embodiment.

In FIG. 23, the light-emitting diode 14 comprises the N-type semiconductor layer 15, the P-type semiconductor layer 17, the lower electrode 19, the insulating layer 21 and the upper electrode (contact electrode) 26. The P-type semiconductor layer 17 is disposed on the N-type semiconductor layer 15. The lower electrode 19 is disposed on a part of the N-type semiconductor layer 15. The insulating layer 21 is disposed on the N-type semiconductor layer 15, a part of the P-type semiconductor layer 17 and the lower electrode 19. The upper electrode (contact electrode) 26 is disposed on the insulating layer 21 and in contact with the P-type semiconductor layer 17. The light-emitting diode 14 is further bonded with the bonding pad 30 of the TFT substrate 12' through the bump 42. The connection structure 44 comprises the N-type semiconductor layer 15', the lower electrode 19', the insulating layer 21 and the upper electrode (contact electrode) 26'. The lower electrode 19' is disposed on the N-type semiconductor layer 15'. The insulating layer 21 is disposed on the lower electrode 19' and the N-type semiconductor layer 15'. The upper electrode (contact electrode) 26' is disposed on the insulating layer 21 and in contact with the lower electrode 19'. The connection structure 44 is further bonded with the bonding pad 30 of the TFT substrate 12' through the bump 42'.

Figure 24:
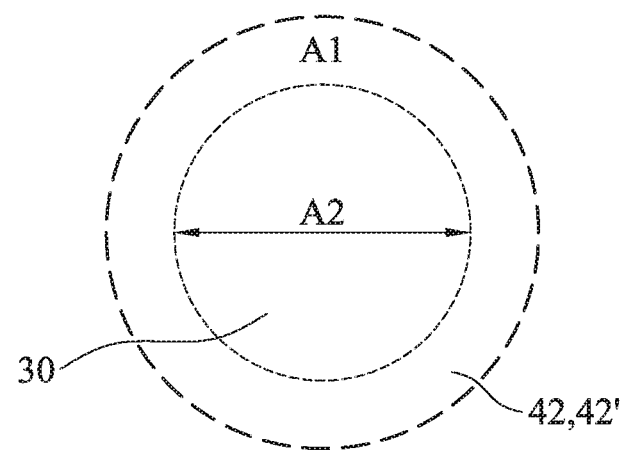
FIG. 24 is a top view of a bonding pad and a bump in accordance with one embodiment of the disclosure.

Specifically, the width L1 of the bumps (42, 42') is greater than the width L2 of the bonding pads 30. Furthermore, the projection area A1 of the bumps (42, 42') is greater than the projection area A2 of the bonding pads 30, as shown in FIG. 24. FIG. 24 is a top view of the bonding pads 30 and the bumps (42, 42') in this embodiment.

Figure 25:
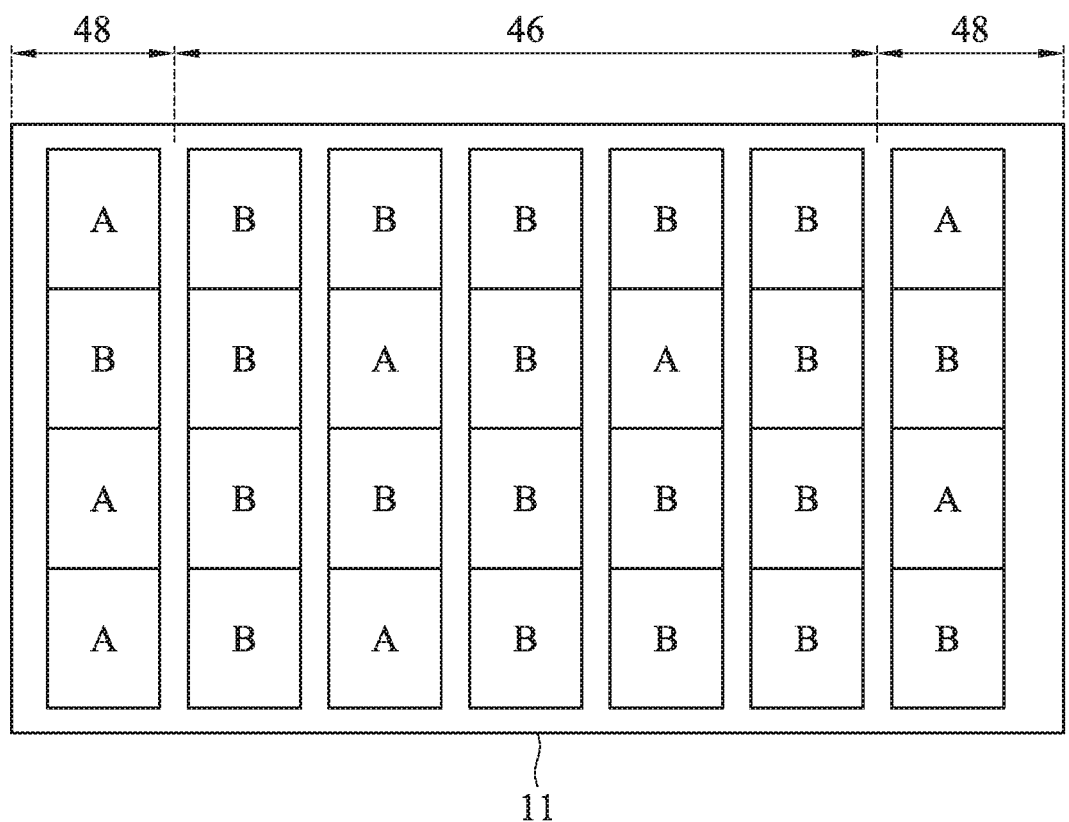
FIG. 25 is a top view of a wafer substrate in accordance with one embodiment of the disclosure.

In some embodiments, the distribution of the connection structures A and the light-emitting diodes B on the wafer substrate 11 is disclosed, as shown in FIG. 25. FIG. 25 is a top view of the wafer substrate 11. In FIG. 25, most of the light-emitting diodes B are disposed on the central area 46 of the wafer substrate 11. Most of the connection structures A are disposed on the peripheral area 48 of the wafer substrate 11. Specifically, the number of the light-emitting diodes B is more than the number of the connection structures A.

It will be apparent to those skilled in the art that various modifications and variations can be made to the disclosed embodiments. It is intended that the specification and examples be considered as exemplary only, with the true scope of the disclosure being indicated by the following claims and their equivalents.

What is claimed is:
1. A display device, comprising:
   a substrate having a surface comprising a display area;
   a plurality of light-emitting diodes disposed on the display area of the substrate, wherein at least one of the plurality of light-emitting diodes comprises a contact electrode;
   a conductive element disposed between the substrate and the at least one of the plurality of light-emitting diodes;
   a plurality of first matrix elements disposed on the substrate;
   an insulating layer covering at least part of the at least one of the plurality of light-emitting diodes; and
   a plurality of bonding pads disposed on the substrate,
   wherein the insulating layer has a cross-sectional sidewall profile, and at least a part of the cross-sectional sidewall profile of the insulating layer is in a shape of a curve, and one of the plurality of first matrix elements is disposed between adjacent two of the plurality of bonding pads, wherein the at least one of the plurality of light-emitting diodes comprises a N-type semiconductor layer and a P-type semiconductor layer, wherein the at least one of the plurality of light-emitting diodes comprises a lower electrode, and wherein the lower electrode has a cross-sectional sidewall profile, and at least a part of the cross-sectional sidewall profile of the lower electrode is in a shape of a curve.

2. The display device as claimed in claim 1, wherein the conductive element is a bump or an anisotropic conductive layer.

3. The display device as claimed in claim 1, wherein one of the plurality of bonding pads is disposed between the conductive element and the substrate.

4. The display device as claimed in claim 3, wherein the anisotropic conductive layer comprises a plurality of the conductive particles.

5. The display device as claimed in claim 4, wherein a diameter of one of the plurality of the conductive particles between the contact electrode and the one of the plurality of bonding pads is smaller than a diameter of one of the plurality of the conductive particles not between the contact electrode and the plurality of bonding pads.

6. The display device as claimed in claim 2, wherein the anisotropic conductive layer is configured to reduce a mixing of light.

7. The display device as claimed in claim 6, wherein the anisotropic conductive layer is black.

8. The display device as claimed in claim 2, wherein a height of one of the plurality of first matrix elements is greater than a maximum height of the anisotropic conductive layer.

9. The display device as claimed in claim 1, wherein a maximum width of one of the plurality of second matrix elements is greater than a maximum width of one of the plurality of first matrix elements.

10. The display device as claimed in claim 1, wherein the one of the plurality of first matrix elements is not overlapped with the plurality of light-emitting diodes in view of a normal direction of the surface.

11. The display device as claimed in claim 1, wherein one of the plurality of second matrix elements overlaps the one of the plurality of first matrix elements.

12. The display device as claimed in claim 1, further comprising a patterned phosphor layer disposed on the light-emitting diodes, wherein one of the plurality of second matrix elements is disposed in the patterned phosphor layer.

13. The display device as claimed in claim 12, wherein the patterned phosphor layer comprises an opening corresponding to one of the plurality of light-emitting diodes.

14. The display device as claimed in claim 1, wherein the first matrix elements or second matrix elements are black matrices.

15. The display device as claimed in claim 2, wherein the anisotropic conductive layer has a cross-sectional sidewall profile and an angle between the surface of the substrate and the cross-sectional sidewall profile of the anisotropic conductive layer is less than 90 degrees.

16. The display device as claimed in claim 15, wherein the angle between the surface of the substrate and the cross-sectional sidewall profile of the anisotropic conductive layer is greater than or equal to 30 degrees.

17. The display device as claimed in claim 1, wherein the P-type semiconductor layer is formed between the contact electrode and the N-type semiconductor layer.

18. The display device as claimed in claim 1, wherein the lower electrode is formed between the insulating layer and the N-type semiconductor layer.

* * * * *